United States Patent
Makkonen et al.

(10) Patent No.: US 12,341,491 B2
(45) Date of Patent: Jun. 24, 2025

(54) LOADED RESONATORS FOR ADJUSTING FREQUENCY RESPONSE OF ACOUSTIC WAVE RESONATORS

(71) Applicant: Teknologian tutkimuskeskus VTT Oy, Espoo (FI)

(72) Inventors: Tapani Makkonen, Espoo (FI); Markku Ylilammi, Espoo (FI); Tuomas Pensala, Espoo (FI); James Dekker, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 462 days.

(21) Appl. No.: 17/703,185

(22) Filed: Mar. 24, 2022

(65) Prior Publication Data

US 2022/0216852 A1 Jul. 7, 2022

Related U.S. Application Data

(63) Continuation of application No. 17/034,711, filed on Sep. 28, 2020, now Pat. No. 11,290,083, which is a
(Continued)

(51) Int. Cl.
*H03H 9/54* (2006.01)
*H03H 9/13* (2006.01)
*H03H 9/17* (2006.01)

(52) U.S. Cl.
CPC ............ *H03H 9/547* (2013.01); *H03H 9/132* (2013.01); *H03H 9/173* (2013.01)

(58) Field of Classification Search
CPC ........ H03H 9/547; H03H 9/132; H03H 9/173; H03H 9/02228
See application file for complete search history.

(56) References Cited

U.S. PATENT DOCUMENTS 7,893,793 B2 * 2/2011 Iwasaki ................. H03H 9/564
333/133
8,058,768 B2 11/2011 Milsom et al.
(Continued)

FOREIGN PATENT DOCUMENTS

CN 101572532 11/2009
CN 102468817 5/2012
(Continued)

OTHER PUBLICATIONS

Meltaus and Pensala, "Laterally Coupled BAW Filter using Two Acoustic Modes", 2013 IEEE Ultrasonic Symp (Year: 2013).*
(Continued)

*Primary Examiner* — Livius R. Cazan
*Assistant Examiner* — Jose K Abraham
(74) *Attorney, Agent, or Firm* — Laine IP Oy

(57) ABSTRACT

The device includes an acoustic wave filter element, and a first resonator. The acoustic wave filter element includes interdigitated input electrodes and output electrodes located on a top surface of a piezoelectric layer and a counter-electrode on a bottom surface of the piezoelectric layer. The acoustic wave filter element provides a response with a sideband at a sideband frequency range. The first resonator includes a first resonator electrode on the top surface of the piezoelectric layer and a first resonator counter-electrode on the bottom surface of the piezoelectric layer. The first resonator has a first notch in resonator impedance at a first frequency. The first resonance frequency is tuned to fall within the sideband frequency range to suppress the sideband by depositing a first mass load on top of the first resonator electrode to reduce the first resonance frequency, or partly removing the first resonator electrode to increase the first resonance frequency.

20 Claims, 11 Drawing Sheets

Related U.S. Application Data continuation of application No. 16/125,632, filed on Sep. 7, 2018, now Pat. No. 10,790,801.

(56) References Cited

U.S. PATENT DOCUMENTS

| | | | |
|---|---|---|---|
| 8,138,855 | B2 | 3/2012 | Jansman |
| 8,258,894 | B2* | 9/2012 | Thalhammer .......... H03H 9/605 |
| | | | 333/133 |
| 8,610,333 | B2* | 12/2013 | Pang ...................... H03H 9/175 |
| | | | 310/313 R |
| 9,124,243 | B2 | 9/2015 | Tamasaki et al. |
| 9,893,712 | B2 | 2/2018 | Meltaus et al. |
| 9,941,857 | B1 | 4/2018 | Olsson et al. |
| 10,790,801 | B2 | 9/2020 | Makkonen et al. |
| 11,290,083 | B2 | 3/2022 | Makkonen et al. |
| 2002/0121945 | A1* | 9/2002 | Ruby ....................... H03H 3/04 |
| | | | 333/191 |
| 2003/0186673 | A1 | 10/2003 | Kimachi et al. |
| 2004/0130411 | A1 | 7/2004 | Beaudin et al. |
| 2005/0200433 | A1* | 9/2005 | Aigner ............... H03H 9/02118 |
| | | | 333/191 |
| 2005/0218754 | A1 | 10/2005 | Yokoyama et al. |
| 2007/0069606 | A1 | 3/2007 | Matsumoto et al. |
| 2007/0139140 | A1* | 6/2007 | Rao .......................... H03H 3/04 |
| | | | 333/188 |
| 2007/0267942 | A1 | 11/2007 | Matsumoto et al. |
| 2008/0079516 | A1 | 4/2008 | Ruby et al. |
| 2009/0127978 | A1 | 5/2009 | Asai et al. |
| 2009/0251235 | A1 | 10/2009 | Belot et al. |
| 2010/0013573 | A1 | 1/2010 | Umeda |
| 2011/0273061 | A1* | 11/2011 | Thalmayr .......... H03H 9/02834 |
| | | | 310/346 |
| 2012/0074811 | A1 | 3/2012 | Pang et al. |
| 2013/0057360 | A1 | 3/2013 | Meltaus et al. |
| 2013/0063227 | A1* | 3/2013 | Burak .................... H03H 9/132 |
| | | | 333/187 |
| 2013/0278356 | A1* | 10/2013 | Meltaus ................. H03H 9/564 |
| | | | 333/187 |
| 2014/0266511 | A1 | 9/2014 | Turner et al. |
| 2016/0294423 | A1* | 10/2016 | Yatsenko ............. H04B 1/1036 |
| 2017/0230031 | A1 | 8/2017 | Yokoyama et al. |
| 2018/0212589 | A1* | 7/2018 | Meltaus ................. H03H 9/547 |
| 2020/0036364 | A1* | 1/2020 | Qiu .................... H03H 9/14538 |
| 2020/0083862 | A1 | 3/2020 | Makkonen et al. |
| 2021/0075401 | A1 | 3/2021 | Makkonen et al. |

FOREIGN PATENT DOCUMENTS

| | | |
|---|---|---|
| EP | 1583233 | 10/2005 |
| EP | 2362545 | 8/2011 |
| FI | 20106063 | 6/2012 |
| GB | 1531759 | 11/1978 |
| JP | 2003-298392 | 10/2003 |
| JP | 2005-286945 | 10/2005 |
| JP | 2013-539946 | 10/2013 |
| JP | 2016-508303 | 3/2016 |
| JP | 2017-139707 | 8/2017 |
| WO | WO 2001/06647 | 1/2001 |
| WO | WO 2008/126473 | 10/2008 |
| WO | WO 2011/131844 | 10/2011 |
| WO | WO 2012/049372 | 4/2012 |
| WO | WO 2012/049374 | 4/2012 |
| WO | WO 2013/068652 | 5/2013 |

OTHER PUBLICATIONS

Kamma A. et.al., "Multi Mode Resonators Based Triple Band Notch UWB Filter", IEEE Microwave and Wireless Component Letters, vol. 27, 2, Feb. 2017 (Year: 2017).*

Notice of Allowance in Chinese Appln. No. 201980058209.4, dated Jul. 19, 2023, 6 pages (with partial English translation).

Office Action in Japanese Appln. No. 2021-537492, dated Oct. 16, 2023, 27 pages (with English translation).

Fattinger et al. "Optimization of acoustic dispersion for high performance thin film BAW resonators," Proc. IEEE International Ultrasonics Symposium, 2005, pp. 1175-1178.

Meltaus et al., "Laterally Coupled BAW Filter using Two Acoustic Modes," Proc. IEEE International Ultrasonics Symposium, Jul. 2013, pp. 232-235.

Meltaus et al., "Laterally Coupled BAW Filters with 5% Bandwidth," Proc. IEEE International Ultrasonics Symposium, Oct. 2010, pp. 966-969.

Meltaus et al., "Laterally coupled solidly mounted BAW resonators at 1.9 GHZ," Proc. IEEE International Ultrasonics Symposium, Sep. 2009, pp. 847-850.

PCT International Search Report and Written Opinion in International Appln. No. PCT/EP2019/073889, dated Nov. 28, 2019, 18 pages.

Pensala et al., "2-D Modeling of Laterally Acoustically Coupled Thin Film Bulk Acoustic Wave Resonator Filters," IEEE Transactions on ultrasonics, ferroelectrics, and frequency control, Nov. 2010, 57(11):2537-49.

Solie, "Tapered transducers-design and applications," Proc. IEEE International Ultrasonics Symposium, 1998, 1:27-37.

Wang et al., "FBAR Laterally Coupled Resonator Filter," 2015 IEEE International Ultrasonics Symposium, 2015, 1-5.

* cited by examiner

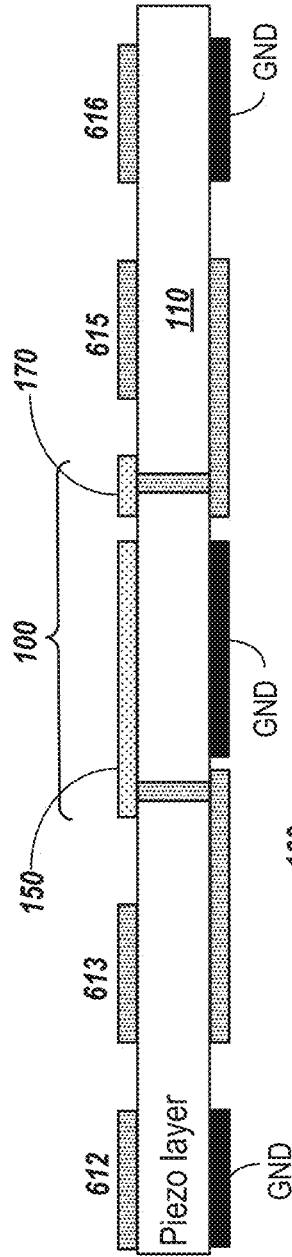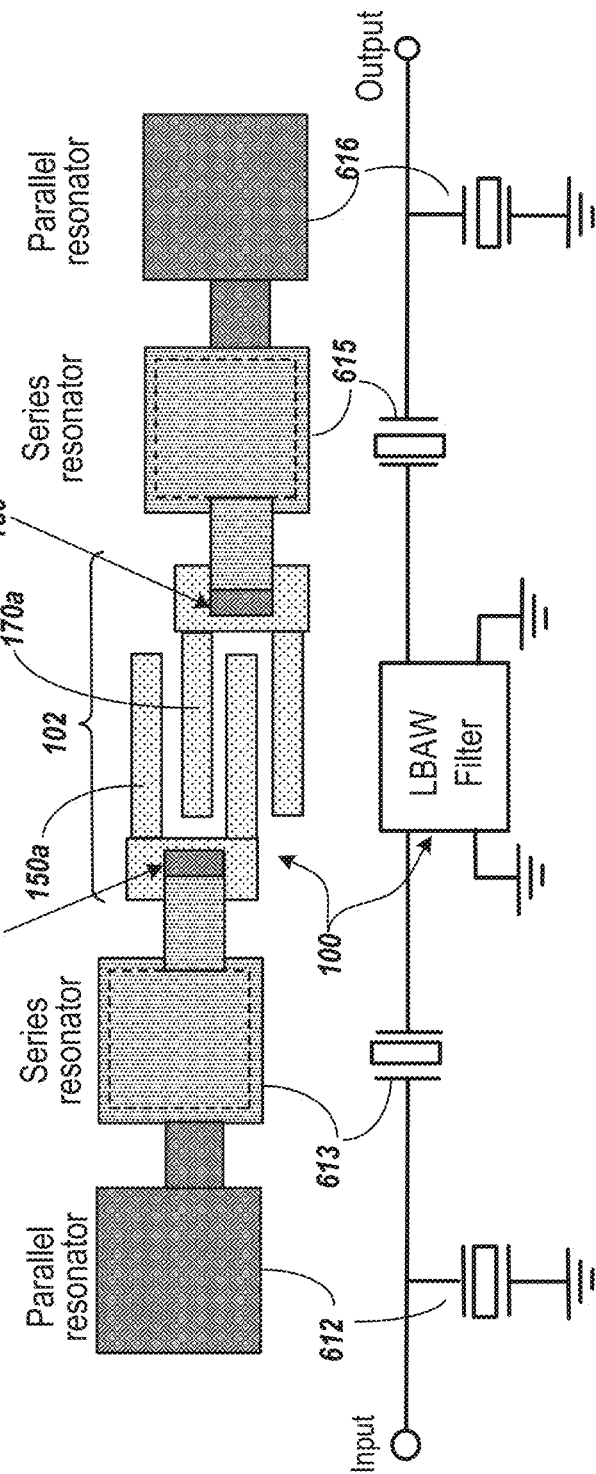
FIG. 6A
FIG. 6B
FIG. 6C

LOADED RESONATORS FOR ADJUSTING FREQUENCY RESPONSE OF ACOUSTIC WAVE RESONATORS

CROSS-REFERENCE TO RELATED APPLICATIONS

This application is a continuation of and claims priority to U.S. patent application Ser. No. 17/034,711, filed on Sep. 28, 2020, which is a continuation of U.S. patent application Ser. No. 16/125,632, filed on Sep. 7, 2018 and issued as U.S. Pat. No. 10,790,801 on Sep. 29, 2020. The disclosure of the prior applications are considered part of and are incorporated by reference in the disclosure of this application.

BACKGROUND

Technical Field

This specification relates to thin film radio-frequency acoustic wave filters.

Background

Radio-frequency ("RF") components, such as resonators and filters, based on microacoustic and thin-film technology are widely used in radio applications such as: mobile phones, wireless networks, satellite positioning, etc. Their advantages over their lumped-element, ceramic, and electromagnetic counterparts include small size and mass-production capability.

SUMMARY

This specification describes technologies for band pass Lateral Bulk Acoustic Wave ("LBAW") filters. More particularly, the present disclosure provides techniques to suppress sidebands in LBAW filters and improve band pass filter characteristic of LBAW filters.

LBAWs can be used as band pass filters. The band pass filter may include one or more undesired (or parasitic) sidebands. Implementations of the present disclosure provide techniques to suppress the undesired sidebands by adding one or more acoustic resonators in parallel with the LBAW.

LBAW filters are formed from a piezoelectric layer sandwiched between two pairs of electrodes. One electrode from each pair is located on the top surface of the piezoelectric layer, and forms an input or an output of the LBAW. The input and output electrodes are separated by a gap. Each pair also has a counter electrode located on the bottom surface of the piezoelectric layer. By applying an alternating voltage across the piezoelectric layer at the input resonator, a mechanical resonance is formed in the piezoelectric layer below the input electrode. The piezoelectric layer thickness and the gap between electrodes can be designed such that this mechanical resonance is coupled across the gap to the output resonator. The frequency range at which such coupling occurs determines the achievable bandwidth (or width of passband) for the LBAW filter.

The foregoing and other embodiments can each optionally include one or more of the following features, alone or in combination.

In general, one innovative aspect of the subject matter described in this specification can be embodied in an acoustic wave filter device that includes an acoustic wave filter element, a first resonator and a second resonator. The first resonator and the second resonator are coupled to the acoustic wave filter element. The acoustic wave filter element includes interdigited input electrodes and output electrodes located on a top surface of a piezoelectric layer and a counter-electrode on the bottom surface of the piezoelectric layer. The first resonator includes a first resonator electrode on the top surface of the piezoelectric layer. The first resonator also includes a first resonator counter-electrode on the bottom surface of the piezoelectric layer. The first resonator has a first notch in resonator impedance at a first frequency. The second resonator includes a second resonator electrode on the top surface of the piezoelectric layer, and a second resonator counter-electrode on the bottom surface of the piezoelectric layer. The second resonator also includes a first mass loading layer on the second resonator electrode such that the second resonator has a second notch in resonator impedance at a second frequency that is different from the first frequency.

The first frequency and the second frequency can be within a sideband of resonator impedance of the acoustic wave filter element. In some examples, the first frequency and second frequency can differ by at least 3%.

The resonator electrode can be electrically coupled to the input electrodes, and the second resonator electrode is electrically coupled to the output electrodes.

The first resonator electrode can be electrically coupled to the input or output electrodes, and the second resonator electrode is electrically coupled to the first resonator electrode. In some embodiments, the first resonator electrode has a first edge facing the acoustic wave filter element, the first resonator electrode has a second edge on a side of the first resonator electrode farther from the acoustic wave filter element, and a third edge connecting the first edge and the second edge. In some examples, the second resonator electrode positioned adjacent the second edge of the first resonator electrode. In some examples, second resonator electrode positioned adjacent the third edge of the first resonator electrode. In some embodiments, the first resonator electrode and second resonator electrode are electrically coupled by sharing a common edge. In some embodiments, the first resonator electrode and second resonator electrode are electrically coupled by a conductive line that bridges a gap between the first resonator electrode and second resonator electrode.

The acoustic wave filter device can include a third resonator coupled to the acoustic wave filter element. The third resonator can include a third resonator electrode on the top surface of the piezoelectric layer, a third resonator counter-electrode on the bottom surface of the piezoelectric layer, the first mass loading layer on the third resonator electrode, and a second mass loading layer on the third resonator electrode such that the third resonator has a third notch in resonator impedance at a third frequency that is different from the first and second frequencies.

The second mass loading layer can be disposed on the first mass loading layer. The first mass loading layer can include a silicon oxide layer. The second mass loading layer can include a silicon nitride layer.

The acoustic wave filter device can include a fourth resonator coupled to the acoustic wave filter element. The fourth resonator can include a fourth resonator electrode on the top surface of the piezoelectric layer, and a fourth resonator counter-electrode on the bottom surface of the piezoelectric layer. The fourth resonator can have a fourth notch in resonator impedance at the first frequency.

In some embodiments, the first resonator electrode is an uppermost layer of the first resonator. In some embodiments, the first mass loading layer does not cover the second resonator electrode.

A first portion of the first mass loading layer can be disposed on the first resonator electrode, and a second portion of the first mass loading layer can be disposed on the second resonator electrode. The first portion and the second portion can have different thicknesses.

The counter-electrode of the acoustic wave filter element, the first resonator counter-electrode, and the second resonator counter-electrode can be provided by a common counter-electrode that continuously spans the acoustic wave filter element, first resonator and second resonator.

The input electrodes, output electrodes, first resonator electrode, and second resonator electrode can be provided by separate portions of the same electrode layer on the top surface of the piezoelectric layer.

In some embodiments, a thickness of the piezoelectric layer and a gap width between the input and output electrodes is such that application of a radio frequency voltage between the input electrodes and the counter electrode will create symmetric and antisymmetric acoustic thickness-extensional resonance modes in the piezoelectric layer.

The acoustic wave filter element can be a laterally acoustically coupled bulk acoustic wave (LBAW) filter.

Another innovative aspect of the subject matter described in this specification can be embodied in an acoustic wave filter device that includes an acoustic wave filter element, a first resonator, and a second resonator. The first resonator and the second resonator are coupled to the acoustic wave filter element. The acoustic wave filter element includes interdigited input electrodes and output electrodes located on a top surface of a piezoelectric layer. The first resonator includes a first resonator electrode on the top surface of the piezoelectric layer. The first resonator has a first notch in resonator impedance at a first frequency. The second resonator includes a second resonator electrode on the top surface of the piezoelectric layer. The second resonator also includes a first mass loading layer on the second resonator electrode such that the second resonator has a second notch in resonator impedance at a second frequency that is different from the first frequency.

Another innovative aspect of the subject matter described in this specification can be embodied in an acoustic wave filter device that includes an acoustic wave filter element, a first resonator, and a second resonator. The first resonator and the second resonator are coupled to the acoustic wave filter element. The acoustic wave filter element includes an electrode located on a top surface of a piezoelectric layer and a counter-electrode located on the bottom surface of the piezoelectric layer. The first resonator includes a first resonator electrode on the top surface of the piezoelectric layer and a first resonator counter-electrode on the bottom surface of the piezoelectric layer. The first resonator has a first notch in resonator impedance at a first frequency. The second resonator includes a second resonator electrode on the top surface of the piezoelectric layer, a second resonator counter-electrode on the bottom surface of the piezoelectric layer. The second resonator also includes a first mass loading layer on the second resonator electrode such that the second resonator has a second notch in resonator impedance at a second frequency that is different from the first frequency.

The subject matter described in this specification can be implemented in particular embodiments so as to realize one or more of the following advantages. Band pass filters described herein improve the band pass response of acoustic filters, e.g., LBAW filters, by suppressing parasitic sidebands. The suppression can be made in particular frequencies or over a range of frequencies. In addition, LBAW filters described herein can be simpler to fabricate because they use only a single piezoelectric layer as compared to two in vertically stacked bulk acoustic wave (BAW) coupled resonator filters. They can also operate at higher frequencies as surface acoustic wave (SAW) filters as their operation is determined more by piezoelectric layer thickness than inter-digital transducer (IDT) electrode dimensions. In some embodiments, LBAW filters can also achieve a wider bandwidth than BAW filters. LBAW filters can perform as filters with a single lithographic patterning step as compared to close to 10 in BAW and can operate without reflectors needed in SAW, and thus in smaller size.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 6A-B are schematic cross-sectional and planar views respectively of a circuit including an LBAW connected to acoustic filter structures.

FIG. 6C is a circuit diagram of the circuit in FIGS. 6A-B.

Like reference numbers and designations in the various drawings indicate like elements.

DETAILED DESCRIPTION

Figure 1A:
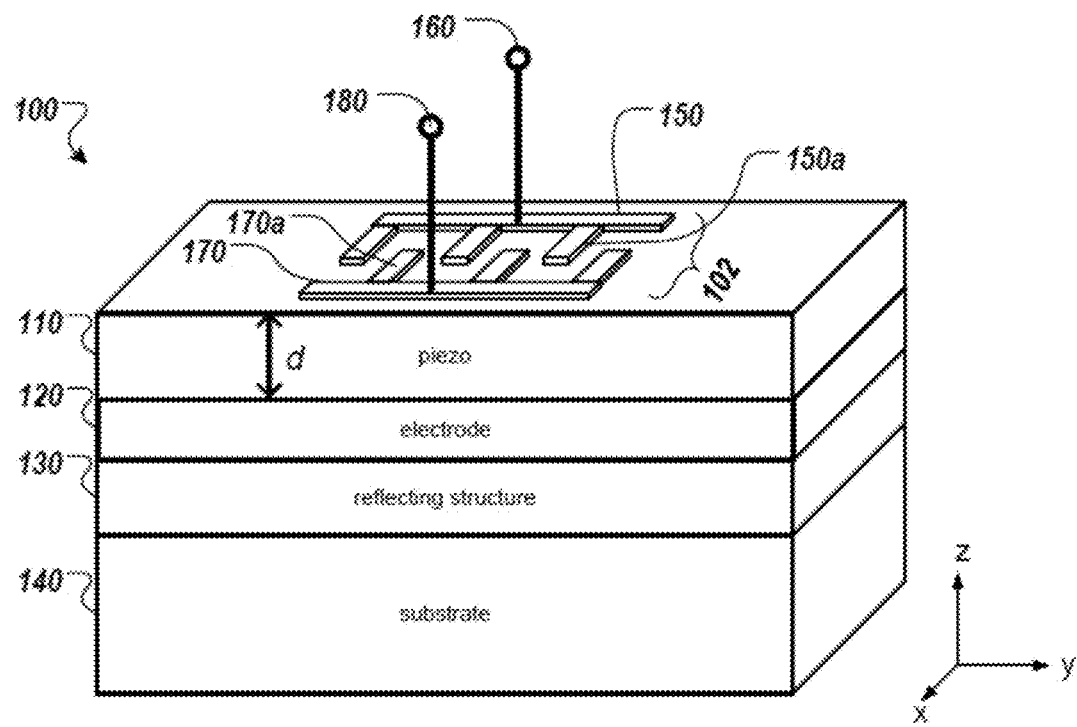
FIG. 1A is a schematic perspective view of a solidly-mounted LBAW filter.
Figure 1B:
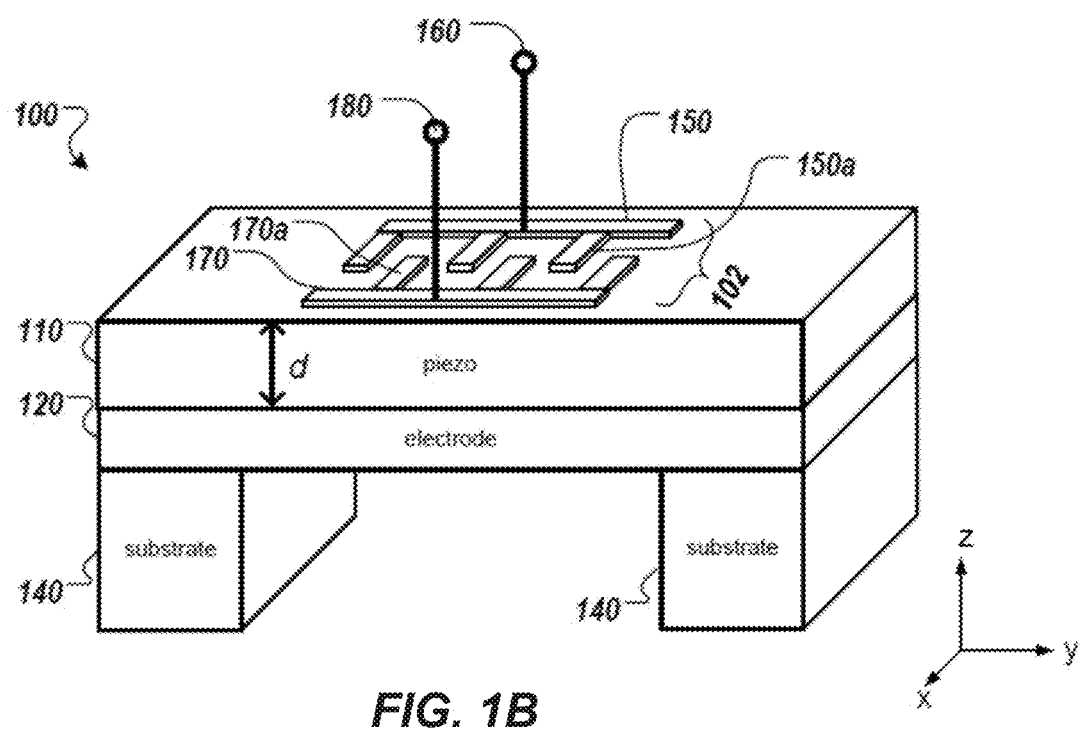
FIG. 1B is a schematic perspective view of a self-supported LBAW filter.
Figure 1C:
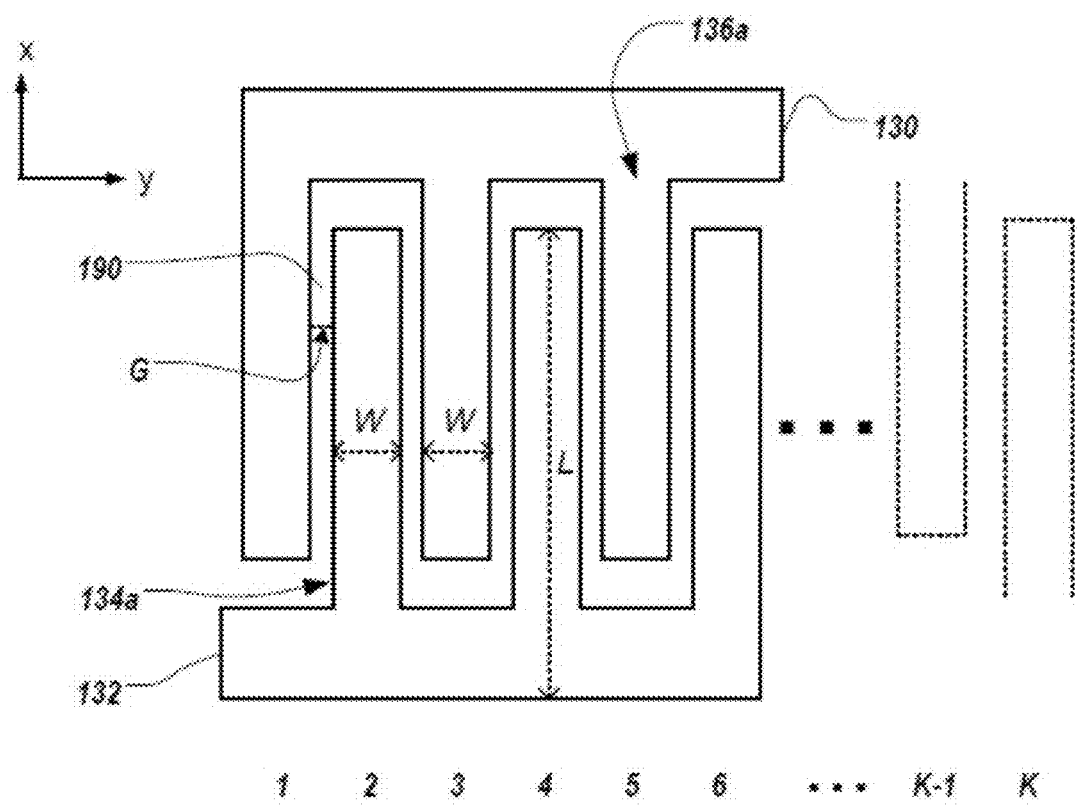
FIG. 1C is a schematic planar view of an interdigital transducer ("IDT") electrode structure.

FIGS. 1A, 1C show an example of an LBAW filter (or resonator) 100 with input 150 and output 170 electrodes that have an interdigitated geometry (also called "interdigital transducer" or "IDT" LBAW). LBAW filter 100 includes a piezoelectric ("piezo") layer 110, having a thickness d, an IDT electrode structure 102 located on the top surface of the piezo layer, and a bottom counter electrode 120 located on the bottom surface of the piezo layer. IDT electrode structure ("IDT") 102 includes two comb-shaped electrodes, 150 and 170, of conductive material, e.g., metal or polysilicon. IDT electrodes 150 and 170 have parallel extensions 150a and 170a, respectively, that provide the "tines" or "teeth" or "fingers" of the "comb." Electrode 150 and counter electrode 120 form an input resonator with piezo layer 110. Electrode 170 and counter electrode 120 form an output resonator with piezo layer 110.

Acoustic vibrations are created in piezo layer 110 by applying an oscillating (or alternating) input voltage across IDT electrode 150 and bottom counter electrode 120 at an input port 160. The applied voltage is transformed into a mechanical (e.g., acoustic) vibration via the piezoelectric effect. Under resonance conditions (e.g., with certain acoustic resonance modes, as detailed further below), this vibration can create a standing wave under input electrode 150 and an evanescent wave (with exponentially decaying amplitude) in the gap region 190. With appropriate selection of vibration frequencies and gap width G, the standing wave can couple mechanically across gap 190 from the piezo region under electrode 150 to piezo region under electrode 170 and create a similar standing wave in piezo layer 110 under electrode 170. The standing wave under electrode 170 results in an output signal voltage with the same frequency at an output port 180 via the reverse piezoelectric effect. The frequency range at which this coupling occurs in mechanical resonance with strong piezoelectric coupling forms the passband (or bandwidth) of LBAW filter 100. In some example, the frequency range is between 1.8 and 1.95 GHz. As discussed further below, the thicknesses and geometries, and spacing of the various layers of LBAW 100 can be tuned to change the RF response and passband of the filter.

A reflecting structure 130 can serve to isolate the vibration in piezo layer 110 from an underlying substrate 140 and to prevent acoustic leakage. Thin layer structure can, for example, be a Bragg reflector composed of alternating high and low acoustic impedance ("$Z_{ac}$") material layers. In some embodiments, the thickness of these layers can be designed such that the frequencies with and near the passband of LBAW filter are reflected back into piezo layer 110 and all other frequencies pass through the mirror.

In some embodiments, LBAW 100 does not directly overlie substrate 140 (as shown in FIG. 1A), but is self-supported, as shown in FIG. 1B. In such arrangement, substrate 140 and mirror 130 are replaced by an air gap, with portions of piezo that extend laterally past the region in which LBAW 100 is fabricated being supported by substrate 140.

In some embodiments, as shown in FIG. 1C, extensions 150a and 170a are rectangular and have a width W, length L, and are spaced by gap width G. Each electrode 150 and 170 has one or more extensions 150a and 170a respectively. The total number of electrode extensions is designated as K.

Although FIG. 1C shows rectangular interdigital electrodes 150/170 with parallel extensions 150a/170a of same geometry and spacing G, other electrode geometries are also contemplated. Design considerations include the gap between electrodes, the length of the electrode, and the number, if any, and shape of electrode extensions. The gap can be used to control coupling between the input and output electrodes. Longer electrodes can also increase coupling. The number of extensions K can be used to control the bandwidth and/or to increase coupling while conserving the area taken up by the electrodes. In some embodiments, the electrodes are composed of rectangular strips, with two or more extensions (e.g., K≥2). For example, each extension can be a rectangular strip. In some embodiments, the electrodes are concentric circles or spirals having a common axis.

Piezo layer 110 can be formed from various piezoelectric materials. Exemplary materials include ZnO, AlN, CdS, PZT, LiNbO$_3$, LiTaO$_3$, quartz, KNN, BST, GaN, Sc alloyed AlN, or the aforementioned materials doped or alloyed with an additional element. Doping can be used to improve or tailor electromechanical properties of piezo layer 110. As detailed further below, piezo layer thickness d is selected such that thickness-extensional modes near the frequencies of the desired bandwidth of the LBAW filter are produced in the piezo layer. In some embodiments, piezo layer thickness d is 20% to 50% of $\lambda_z$, or 30% to 45% of $\lambda_z$, where $\lambda_z$ is the wavelength of the piezoelectric vibration in the thickness direction. In some embodiments, d is 1500 nm to 2500 nm, or 1800 to 2200 nm.

Thin film IDT 102 can be composed of various materials. In some embodiments, IDT electrodes 150 and 170 are metal. For example, the electrode material includes Al, Mo, Pt, Cu, Au, Ag, Ti, W, Ir, Ru, or multilayers of metals and/or metals doped with additional materials, e.g. AlSi, AlSiCu, polysilicon, etc. Doping can be used to improve or tailor IDT electric or mechanical properties.

Although FIG. 1A shows a single common counter electrode 120, filter 100 can include separate electrodes for the input and output resonators. Various materials are suitable for the counter electrode(s) (e.g., electrode 120). For example, the electrodes can include a metal, such as Al, Mo, Pt, Cu, Au, Ag, Ti, W, Ir, Ru, or multilayers of metals and/or metals doped with additional materials, e.g. AlSi, AlSiCu etc. Doping can be used to improve or tailor IDT electric or mechanical properties. For example, the electrodes can be Ti+Mo, Ti+W, AlN+Mo, or Al+W. The electrodes can be multilayered. The electrodes can have a special thin seed layer deposited below the electrode.

Reflecting structure 130 can be composed of alternating layers of different materials. For example, reflecting structure 130 can include alternating layers of two of: Tungsten (W), SiO$_2$, silicon (Si), carbon (C). For example, layers of high acoustic impedance include be W, Mo, Ir, Al$_2$O$_3$, diamond, Pt, AlN, Si$_3$N$_4$. Layers of low acoustic impedance can include SiO$_2$, glass, Al, Ti, C, polymers, or porous materials. Layer of Si provides an intermediate acoustic impedance. Various materials are suitable for the substrate 140, such as Si or SiO$_2$ or glass, sapphire, quartz. Substrate 140 materials can have high electrical resistivity. The substrate can have a thickness appropriate for RF applications, such as integration into mobile phone platforms. For example, the substrate can have a thickness less than 500 microns, or less than 200 microns. For example, Si wafers can be purchased with a thickness of 675 μm and thinned down to achieve a desired device thickness, e.g., for mobile platforms.

Modeling of the acoustic response of LBAW 100 can provide guidance on how to tune the design parameters for individual elements of the structure to achieve desired bandpass properties. For example, LBAW 100 can be designed to have resonance modes at specific frequencies. In general, the geometry of various LBAW 100 components can be selected to achieve various acoustic properties. LBAW 100 properties can depend on the combination of these geometries, which may not be independent of one another.

Figure 2A:
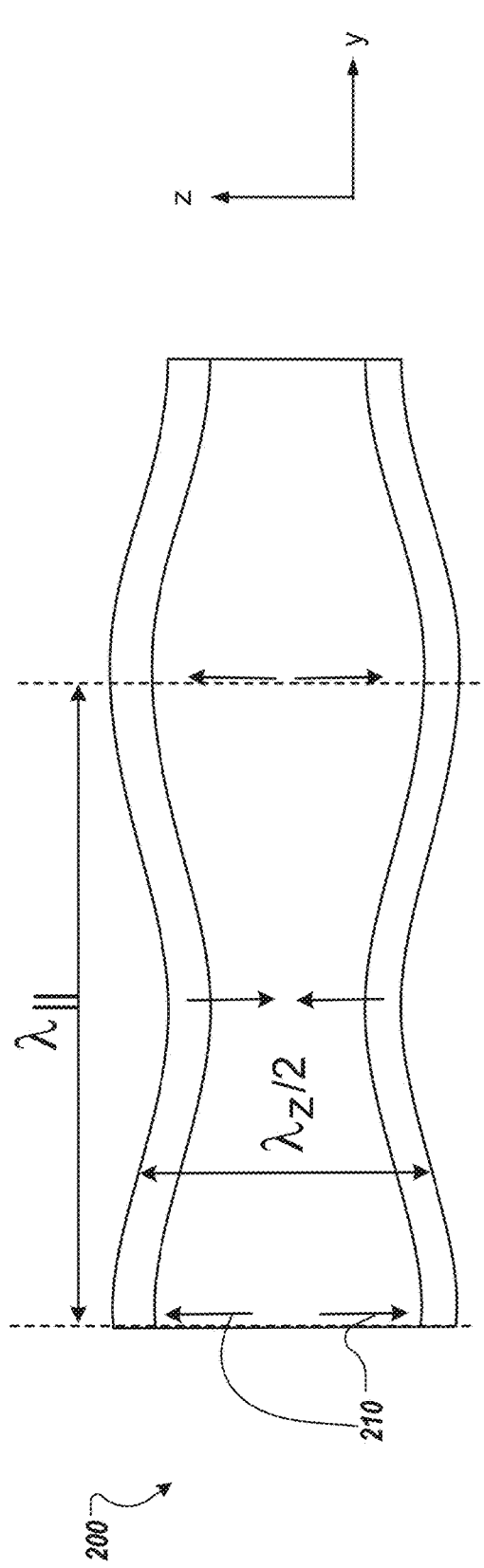
FIGS. 2A-B are schematic diagrams of two types of propagating plate wave modes in LBAW piezo layer.
Figure 2B:
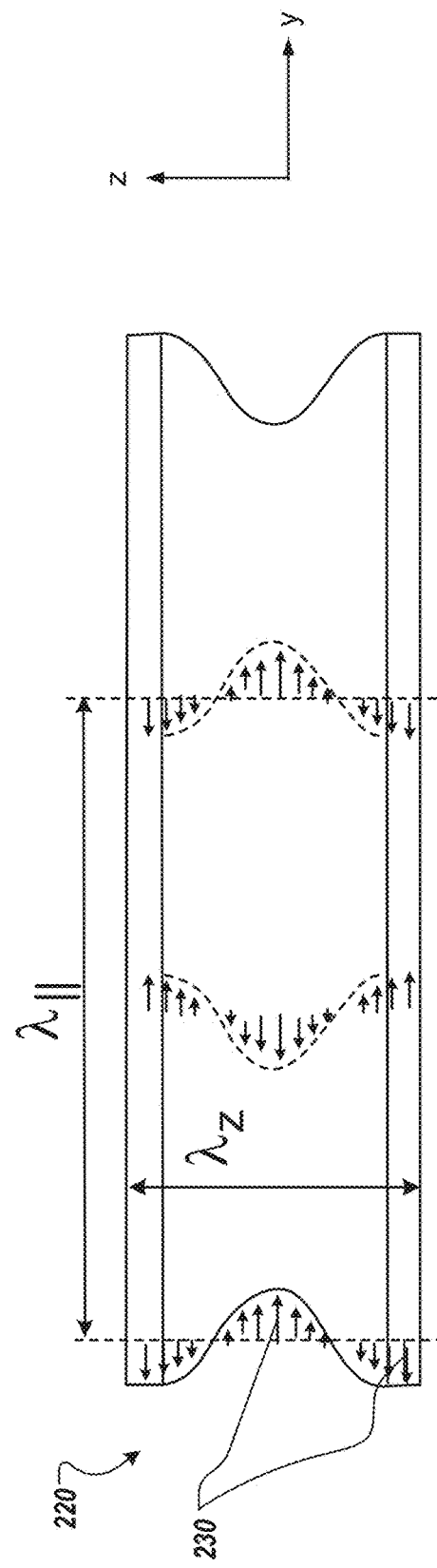

In piezoelectric layer 110, different bulk acoustic vibration modes can arise at different excitation frequencies f of input voltage (e.g., at port 160). Acoustic vibrations in piezo layer 110 can propagate laterally as Lamb waves (or plate waves), wherein particle motion lies in the plane that contains the direction of wave propagation and the plate normal (e.g., the z-axis in FIG. 1A). Two such modes are shown in FIGS. 2A-2B. Referring to FIG. 2A, a thickness-extensional (TE or longitudinal) bulk mode 200 has particle displacement 210 dominantly perpendicular to the propagation direction (in the z-direction). Referring to FIG. 2B, a second order thickness-shear (TS2) bulk mode 220 has particle displacement 230 dominantly parallel to the propagation direction (in the y-direction). For both modes, the lowest frequency at which resonance in the thickness direction can arise is when the thickness d of piezo layer 110 is equal to an integer number of half wavelengths $\lambda_z$ (disregarding the thickness of electrodes 150/170); in other words, when $$d = \frac{N\lambda_z}{2},$$

where N is an integer that indicates the order of the resonance. For the TE1 mode, $$d = \frac{\lambda_z}{2}.$$

As discussed further below, the width W of the electrodes and the gap G between electrodes can be designed such that TE1 mode standing waves with certain lateral wavelengths $\lambda_\parallel$ are formed that can couple through their evanescent tails across gap G to create two mechanical resonant modes.

Figure 3:
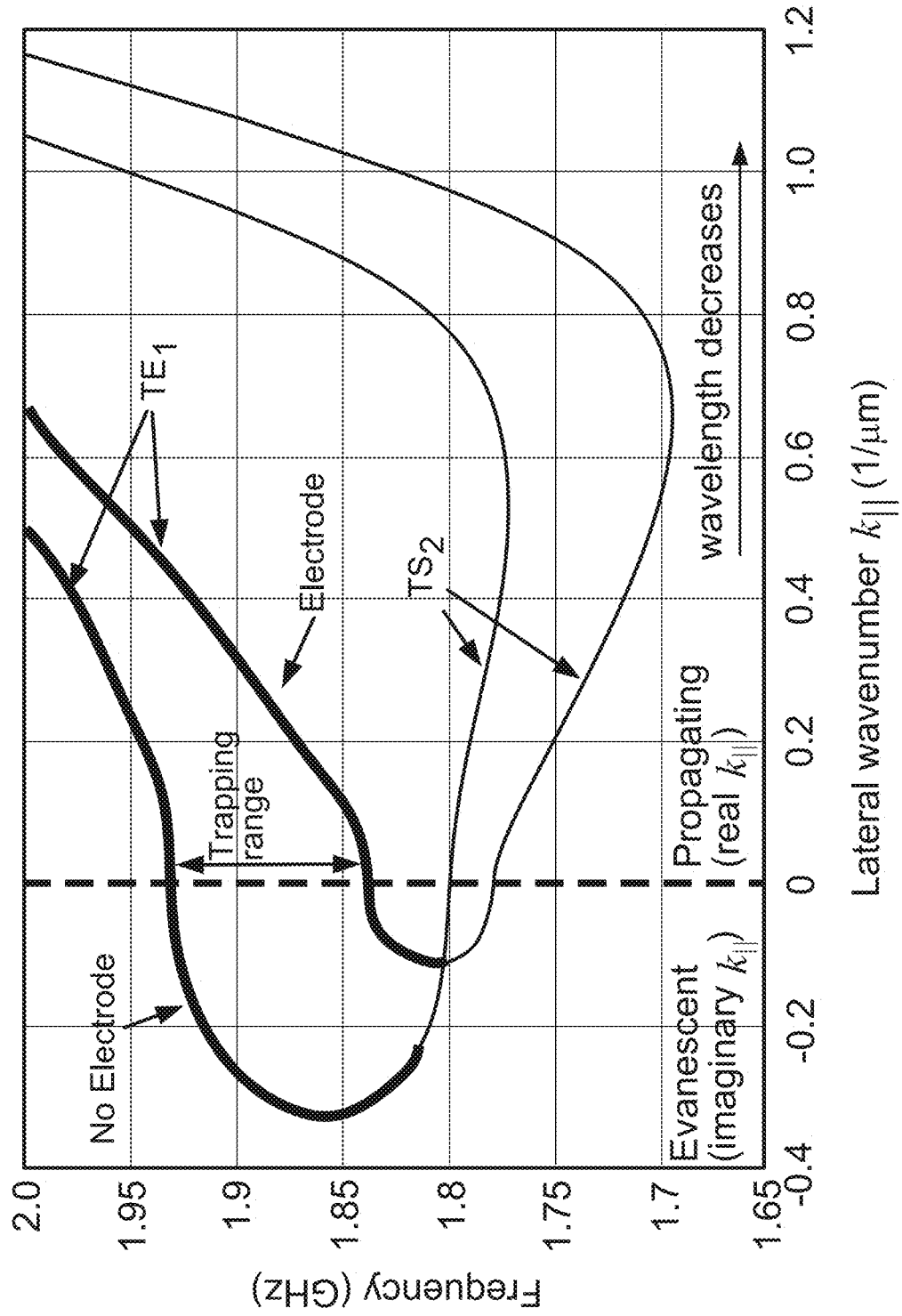
FIG. 3 is a dispersion curves for an exemplary LBAW.

Acoustic properties of an LBAW resonator 100 can be described with dispersion curves. Referring to FIG. 3, an example dispersion curve for an LBAW 100 shows the lateral wave number $k_\parallel$ of the vibration, where $$k_\parallel = \frac{2\pi}{\lambda_\parallel},$$

as a function of voltage input frequency f. The first-order longitudinal (thickness extensional, TE1) vibration mode, in which the combined thickness of the piezoelectric layer d and the thickness of electrode(s) 150 or 170 contains approximately half a wavelength of the bulk vibration, $\lambda_z/2$, and the second-order thickness shear (TS2) mode, in which the bulk vibration is dominantly perpendicular to the thickness direction (z-axis in FIG. 2B) and one acoustic wavelength $\lambda_z$ is contained in the combined piezoelectric layer thickness d and the thickness of electrode(s) 150 and 170, are denoted in the figure. The TE1 mode is the darker portion of each dispersion curve, and TS2 mode is the lighter region of each dispersion curve. The top curve ("no electrode") represents the dispersion properties of the piezoelectric layer under the gap 190. The bottom curve ("electrode") represents the dispersion properties of the piezoelectric layer under electrodes 150/170, also known as the active region. More specifically, where the "electrode" curve intersects k=0, the TE1 mode has approximately $\lambda_z/2$ contained in the combined thickness of the electrodes 150 or 170 and the piezoelectric layer. This is approximate because the wave can extend into the Bragg reflector. "No Electrode" curve intersection with k=0 lines shows the modes where approximately $\lambda_z/2$ is contained in the combined thickness of the bottom electrode only and the piezolayer. This type of dispersion, in which the TE1 mode has increasing $k_\parallel$ with increasing frequency f, is called Type 1. The difference in intersect $k_\parallel$=0 frequencies between electrode and non-electrode areas determined the hard limits for the achievable bandwidth of the filter. The gap width G, electrode width W, and number of extensions K can be used to vary the coupling strength within the limits set by the dispersion difference.

In some embodiments, LBAW 100 can be designed to produce Type 1 dispersion. For example, piezo layer 100 materials can be selected in which Type 1 dispersion can occur. For example, ZnO can be used. In another example, appropriate design of acoustic Bragg reflector 130 can help achieve Type 1 dispersion. For example, using Aluminum nitride ("AlN") for piezo layer 110 can typically produce a Type 2 dispersion, where TE1 mode behaves non-monotonically having initially decreasing $k_\parallel$ with increasing frequency f, and then increasing $k_\parallel$ with increasing frequency f, (roughly similar to what is described in the dispersion curves of in FIG. 3 but with TE1 and TS2 interchanged). However, in some embodiments, with an appropriate design of the reflecting structure 130 (e.g., acoustic Bragg reflectors), the LBAW 100 can use AlN in piezo layer 100 and still achieve a Type 1 dispersion. See for example Fattinger et al. "Optimization of acoustic dispersion for high performance thin film BAW resonators," Proc. IEEE International Ultrasonics Symposium, 2005, pp. 1175-1178.

In FIG. 3, positive values of denote real wave numbers (propagating waves) and negative $k_\parallel$ values correspond to imaginary wave numbers (evanescent waves). For a resonance to arise, the acoustic energy must be trapped inside the LBAW resonator structure. In the thickness (z-axis) direction, isolation from the substrate (using reflecting structure 130) can be used for energy trapping. In the lateral direction, energy trapping can occur when an evanescent wave forms outside the electrode region (e.g., on the "no electrode" curve). To get resonant coupling between the two resonators (e.g., electrodes 150/170 and 120) of an LBAW, standing waves of a TE1 mode form in the active regions of the piezo layer (under the electrodes), and evanescent waves form in the "no electrode" region. In other words, $k_\parallel$ is positive for the TE1 "electrode" curve and negative for the TE1 "no electrode" curve. According to FIG. 3, this occurs in the labeled "trapping range" frequency range. Energy trapping can be easier to realize in Type I dispersion. Without wishing to be bound by theory, with monotonically increasing dispersion curves as the thick TE1 lines in FIG. 3, for the "Electrode", at a single frequency in the trapping range there is either a single imaginary wave number available or above the trapping range a single real wave number. The former means that the TE1 does not propagate outside the electrode, and the latter that the TE1 can couple to a propagating wave outside the electrode and thus "leak". The Type 2 dispersion can be described by similar curves but with the TE1 and TS2 curves interchanged. The fact that the curve in Type 2 is non-monotonic means that at a given frequency there may be several real wavenumbers. Having several wavenumbers for a frequency means propagating waves are available outside the electrode, which can cause a "leak".

Figure 4A:
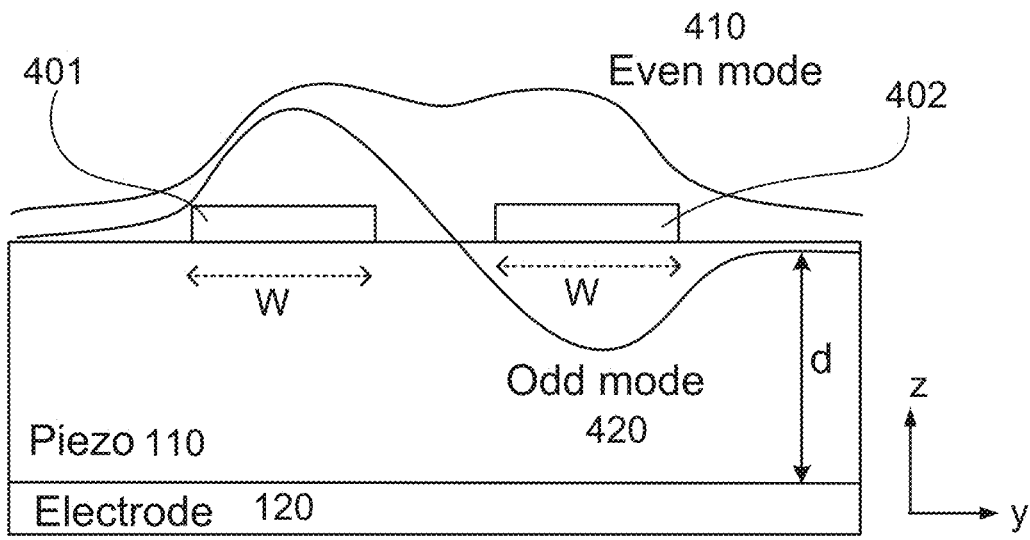
FIG. 4A is a schematic diagram of two resonant modes in an LBAW.
Figure 4B:
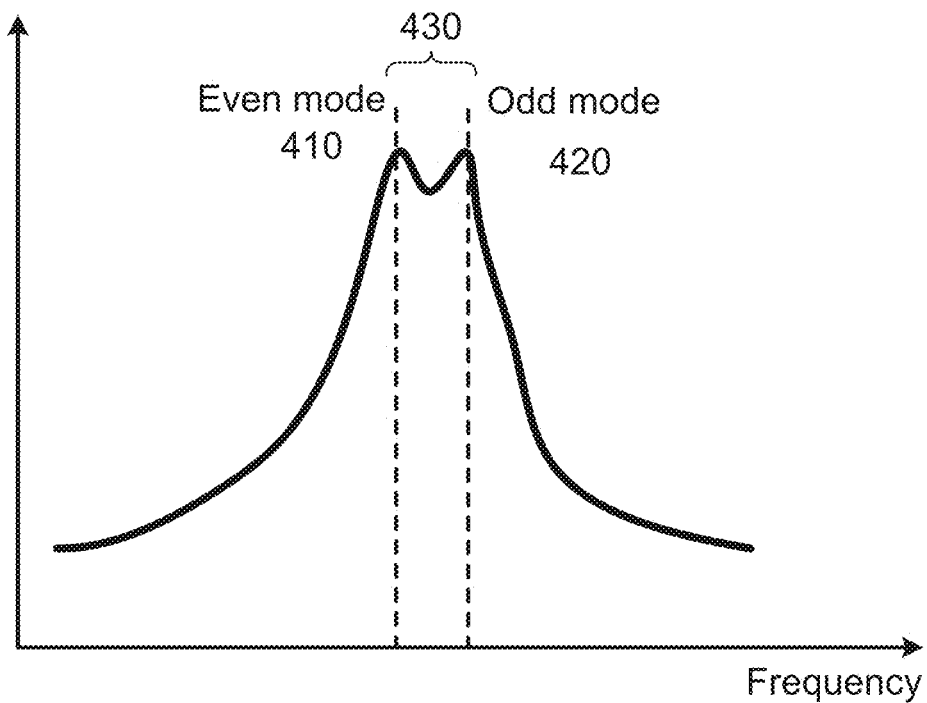
FIG. 4B is an illustrative transmission response of an LBAW as a function of frequency.

FIGS. 4A-4B illustrate the relationship between standing wave resonance modes and the LBAW bandgap. Referring to FIG. 4A, a portion of LBAW 100 includes two adjacent electrodes 401 and 402 with width W (e.g., corresponding to extensions 150a and 170a of respective electrodes 150 and 170 of FIG. 1A). The bandpass frequency response of LBAW 100 is formed by two (or more) laterally standing resonance modes, 410 and 420, arising in the structure. Lateral standing wave resonance can arise when plate waves are reflected from edges of electrodes 401 and 402. In the even mode resonance 410, the piezo layer under both electrodes 150 and 170 vibrates in-phase, whereas in the odd mode resonance 420, the phases are opposite. The even lateral standing wave resonance can arise when the total width of the structure is roughly equal to half of the lateral wavelength $\lambda_\parallel$ of the mode:

$$\frac{\lambda_{even}}{2} = \frac{\lambda_\parallel}{2} \approx 2 \cdot W + G.$$

In the limit of infinitely small gap width G, $\lambda_{even}$ approaches the total width from below. As shown in FIG. 4A, $\lambda_{even}$ gets smaller when G gets larger and gets larger when G gets larger. In case of small gap (e.g., zero-gap) $\lambda_{even}$ gets close to 4 W and in case of a large gap $\lambda_{even}$ gets close to 2 W. The odd lateral standing wave resonance can arise when the width of the electrode is roughly equal to half of the lateral wavelength $\lambda_\parallel$ of the mode:

$$\frac{\lambda_{odd}}{2} = \frac{\lambda_\parallel}{2} \approx W.$$

Referring to FIG. 4B, the even 410 and odd 420 modes are shown as transmission peaks as a function of input frequency f for an LBAW with Type 1 dispersion. For Type 1 dispersion, even mode 410 has a longer wavelength and is lower in frequency than the shorter-wavelength odd mode 420. The frequency difference 430 between the modes determines the achievable bandwidth of LBAW filter 100, and depends on the acoustic properties of the structure and on the dimensions of IDT resonator 102. Acoustic coupling strength can be defined in terms of the (resonance) frequency difference between even (symmetric) and odd (antisymmetric) resonances:

$$\frac{f_{asymm} - f_{symm}}{f_0},$$

where $f_{symm}$ and $f_{asymm}$ are the symmetric and antisymmetric eigenfrequencies, respectively, and $f_0 = (f_{symm} + f_{asymm})/2$ is the center frequency between the two modes.

In some embodiments, increasing the number of extensions (e.g., 150a and 170a) in each electrode (e.g., 150 and 170) can increase the frequency difference between the even and odd mode in the LBAW, and thus increase the bandwidth. This effect can result from the fact that the lateral wavelength of the odd mode can depend on the periodicity of the electrode structure (e.g., width W), while the even mode can depend on the entire width of the structure (e.g., adding up all widths W and gaps G). For example, if the total number of electrode extensions K, the electrode width is W, and the gap width is G, the wavelength $\lambda_\parallel$ of the lateral acoustic wave at the even mode resonance frequency approaches or is slightly shorter than:

$$\frac{\lambda_{even}}{2} \approx K \cdot W + K \cdot G.$$

The odd lateral standing wave resonance in this structure, however, approaches or is slightly larger than:

$$\frac{\lambda_{odd}}{2} \approx W.$$

Additionally, or alternatively, in some embodiments, the total width of the structure K·W+K·G can be such that the highest-order mode trapped in the structure is the desired odd mode resonance. For example, K can be 31, W can be 3 µm, and G can be 2 µm.

In some embodiments, the number of electrode extensions K is between 2 and 200, or between 10 and 60. In some embodiments, the length L of electrode extensions can be between 50 µm and 2000 µm, or between 70 µm and 500 µm.

In some embodiments, the gap G is selected to allow coupling of the evanescent tails of standing waves formed under electrodes 150 and 170. For example, the gap G between electrode extensions can be 0.1 µm and 10 µm, or between 2 µm and 5 µm.

In some embodiments, electrode 150 and 170 topology can be designed such that the gap width G provides good enough coupling between electrode extensions to create a single even mode 410 across the entire width of the structure. For example, the gap width G can be 2%-300%, or 10%-100% of the evanescent acoustic wave's decay length, i.e. the length at which amplitude $A = A_0 \cdot e^{-1}$ of the original amplitude $A_o$, in the gap at the desired even resonance mode. Gap with G can be optimized. Decreasing the gap to a too small width (1) can eventually pull the even and odd modes too far from each other creating a dip in the passband, (2) can lead to reduced coupling coefficient for the odd mode, or (3) can increase capacitive feedthrough from finger to finger causing poor out of band attenuation.

In some embodiments, gap width G can be defined with respect to piezo layer thickness d. For example, G can be designed to be 10% to 300% of d, or 25% to 150% of d.

In some embodiments, the width of electrode extensions W can be between 0.1 µm and 30 µm, or between 2 µm and 5 µm. In some embodiments, W can be designed such that the wavelength $\lambda_\parallel$ of the lateral acoustic wave at the desired odd mode resonance frequency $\lambda_{odd}$ is obtained.

In some embodiments, electrode width W is designed such that multiple half-wavelengths cannot fit within the electrode width. For example, W can be designed to be smaller than the lateral acoustic wave's wavelength $\lambda_\parallel$ at the desired odd resonance mode, e.g., where $\lambda_\parallel = \lambda_{odd}$.

In some embodiments, the thicknesses of various LBAW 100 components can be selected to achieve various acoustic properties and may be interdependent. For example, the piezo layer 110 thickness d (minimum and maximum value) can first be determined with respect to the acoustic wavelength in the piezo material ($\lambda$) at the operation frequency f. In some embodiments, thicknesses (min and max) of the other LBAW 100 layers can be selected based on the choice of piezo thickness d. For example, the combined thickness of the electrodes (including the counter electrode 120) and the piezoelectric layer can be selected to be approximately half a wavelength of the mode that is being used, for example longitudinal bulk wave for the thickness extensional mode. Fundamental modes with N=1 (the first mode, i.e., first harmonic) can allow for greater coupling, but N>1 modes are also possible. For example, the thickness of electrodes 150 and 170, bottom electrode 120, and reflecting structure 130 can be defined as a percentage of piezo layer thickness d. In some embodiments, once all thickness are selected, the geometry of the electrode extensions 150a and 170a, such as number K, width W, gap G, and length L, can be tuned to match the LBAW 100 electrical impedance to the system impedance. Without wishing to be bound by theory, impedance matching can help avoid losses and reflections in the system.

In some embodiments, thickness of electrodes 150 and 170 is between 1% to 30% of d, or 2% to 25% of d, or 3% to 15% of d.

In some embodiments, the thickness of bottom electrode 120 is between 5% to 50% of d, or 10% to 30% of d, or 10% to 20% of d.

In some embodiments, where the reflecting structure 130 is a Bragg reflector, the alternative layers of the reflector can be designed such that the required reflectivity of passband wavelengths is obtained. For example, the thickness of each layer can be equal to or less or more than one quarter of the acoustic wavelength $\lambda_z$ in the thickness direction to reflect the odd and even TE1 resonance modes. In some embodiments, a single layer in the Bragg reflector can be 15% to 80% of d, or 20% to 70% of d.

The mass loading of the IDT 102, determined by the thickness and material of electrodes 150 and 170, can be designed such that the frequency difference between the $k_{\parallel}=0$ frequency of the electrode region's TE1 mode and the outside electrode region's TS2 mode is small. Without wishing to be bound by any particular theory, when the frequency difference between outside region's TS2 mode and electrode region's TE1 mode is small, the trapping range is large. More particularly, the $k_{\parallel}=0$ frequency of the outside region's TS2 mode can be 95%-99% of the electrode region's TE1 cutoff frequency. The frequency difference between the outside region's TS2 and outside region's TE1 modes' $k_{\parallel}=0$ frequencies is designed to be large, e.g. 5%-15%, for example 6.5%-7.5%, of the electrode region's TE1 mode cutoff frequency.

According to certain embodiments of the present invention, the $k_{\parallel}=0$ frequency of the outside region's TS2 mode is greater than, or equal to 98%, or between 98% and 99.5%, or is 98.9% of the electrode region's TE1 cutoff frequency. Similarly, the frequency distance expressed as the frequency difference between electrode region TE1 and outside region TS2 $k_{\parallel}=0$ frequencies:

$$\frac{\text{electrode } TE1 - \text{outside } TS2}{\text{outside } TS2}$$

should be small, for example on the order of 1%. As an example, said frequency distance can be between 0.2% and 2.1%, or between 0.5% and 1.8%, or between 0.8% and 1.5%, or for example, 1.1%.

Figure 5:
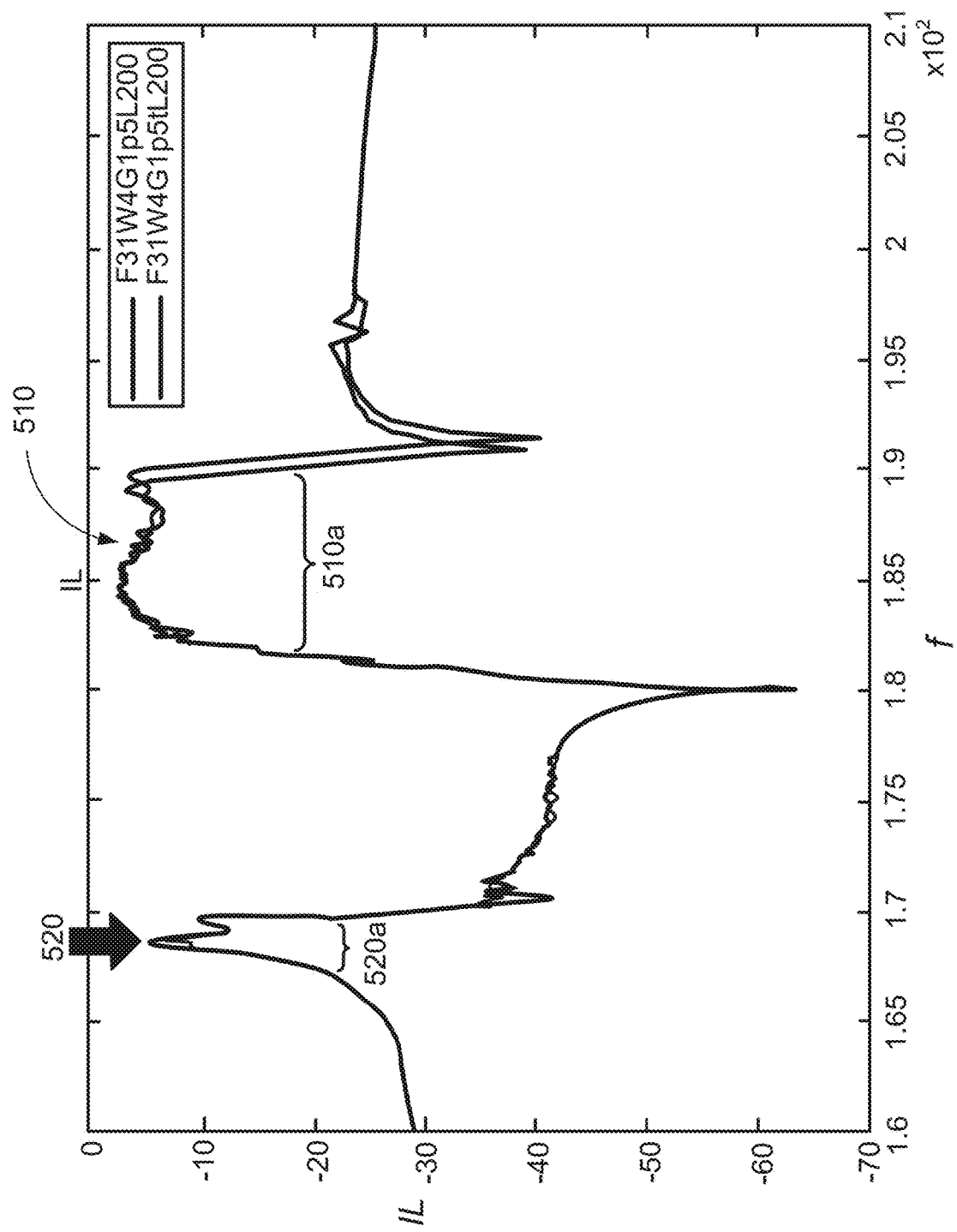
FIG. 5 is an experimental transmission curve of an LBAW as a function of frequency.

FIG. 5 shows a curve of insertion loss IL (in decibels) versus frequency f for an exemplary LBAW 100. The curve shows two passbands with peak 510 corresponding to TE1 waves and peak 520 corresponding to TS2 waves. As discussed above, the width of each passband is determined by the frequency difference of the even and odd modes for the respective type of wave. Here, the TS2 modes correspond to sideband 520*a* (also referred to herein as "TS2 passband"), and the TE1 modes correspond to passband 510*a* (also referred to herein as "TE1 passband"). In some embodiments, LBAW 100 is designed to suppress peak 520 corresponding to TS2 modes, while maintaining the properties of peak 510 corresponding to TE1 modes. Without wishing to be bound by any particular theory, TE1 mode operation can be selected because piezo thin film materials have electromechanical coupling that is stronger in the thickness direction. In other words, TE1 longitudinal mode vibrations couple more efficiently to the electrical excitation over the thickness of piezo layer 110.

In some embodiments, LBAW 100 can be designed to have a passband for TE1 modes between 0.5 and 10 GHz, or between 1 and 4 GHz. In some examples, TE1 passband is between 1.8 and 3.7 GHz. The limits of the passband can incorporate design considerations. For example, the dimensions of the device can grow very large or very small. Too large dimensions may take too much space and cause inefficiencies. Too small dimensions can deteriorate performance due to thin and narrow electrodes leading to resistance and losses. In some embodiments, LBAW 100 can be designed to have a TE1 passband width 510*a* of 0.5-15% relative to center frequency, e.g., 10% relative to center frequency, or 5%, or 2%, or 1%. In some embodiments, the insertion loss at the passband is better than −7 dB, e.g., −7 dB to −0.5 dB or −5 dB to −0.5 dB.

LBAWs can be used as bandpass filters. The IDT electrodes of an LBAW can be designed to couple a driving electrical signal to a desired fundamental TE1 mode. An effective coupling results in a passband similar to the TE1 passband of 510*a* in FIG. 5. However, the coupling also results in one or more sidebands similar to the sideband 520*a*. The sideband 520*a* can be at a lower frequency than passband 510*a*, and can be narrower than the passband 510*a*. The sideband 520*a* is generated because of electric field between the parallel extensions (e.g., the extensions 150*a* and 170*a*) of LBAW. The extensions cause an asymmetrical electric field in the thickness direction of the piezo, and the asymmetrical electric field couples to both the TE1 and TS2 modes.

Implementations of the present disclosure provide techniques to suppress LBAW sidebands created by TS2 modes. The implementations suppress the sidebands by connecting acoustic resonators to the LBAW. At least one of the acoustic resonators has an impedance notch at a resonance frequency within the bandwidth of the sideband. As explained in further details below, the impedance notch causes an increase in insertion loss of the LBAW at the resonance frequency, and results in an overall increase of the insertion loss in the sideband.

The acoustic resonators can be added in series or in parallel with LBAW 100. For example, referring to FIGS. 6A-B, cross-sectional and planar views of structure 600 include LBAW 100 connected to resonators 612, 613, 615, and 616. FIG. 6C shows the corresponding circuit diagram of structure 600. In structure 600, piezo layer 110 is common to LBAW 100 and all connected filters. Moving from left to right of FIG. 6B, parallel resonator 612 and series resonator 613 are located before input port 160 of LBAW 100. Series resonator 615 and parallel resonator 616 are located after output port 180 of LBAW 100. In parallel resonators 612, 616, the lower electrode is grounded. In series resonators 613, 615, the signal goes to the lower non-grounded electrode across piezo layer 110.

Embodiments with one or more series resonators can be designed so that resonance frequencies of the series resonators fall within passband frequencies of the sideband, and suppress the sideband. An acoustic resonator (e.g., a BAW/FBAR resonator) has a very high impedance at its anti-resonance frequency. Such high impedance prevents the driving electrical signal to pass through and reduces signal transmission though the filter. Thus, a resonator with one or more anti-resonance frequencies within sideband of an LBAW filter can be added in series to the LBAW filter to reduce signal transmission at the one or more resonance frequencies (which would be parallel frequencies with the LBAW) and suppress LBAW's sideband.

Embodiments with one or more parallel resonators can be designed so that resonance frequencies of the parallel resonators fall within passband frequencies of the sideband, and suppress the sideband. An acoustic resonator (e.g., a BAW/FBAR resonator) has a very low impedance at its resonance frequency. Such low impedance shunts the driving electrical signal to ground and reduces signal transmission though the filter. Thus, a resonator with one or more resonance frequencies within sideband of an LBAW filter can be added in parallel to the LBAW filter to reduce signal transmission at the one or more resonance frequencies (which would be series frequencies with the LBAW) and suppress LBAW's sideband. In general, one or more parallel resonators can be integrated to an LBAW filter by (i) using input or output electrodes of the LBAW as parallel resonators (e.g., similar to FIGS. 7A-C), and/or by (ii) connecting the one or more parallel resonators to the LBAW filter (e.g., FIGS. 9A-B).

The frequency of a resonator can be tuned by selecting the mass loading of the resonator. The mass loading can be achieved by applying one or more mass loading layers on one or both electrodes of the resonator. The mass loading layer can be composed of a different from or the same material as the underlying electrode. In the latter case, the two resonators can be considered to have electrodes of different thickness.

Different mass loading between two resonators can be achieved by i) applying a mass loading layer on an electrode of one resonator but not on the electrode of the other resonator, ii) applying different thicknesses of the same material on the two respective electrodes of the two resonators, and/or iii) by applying layers of different materials on the two respective electrodes of the two resonators. In addition, different mass loading between two resonators can be achieved by having the electrodes of the two resonators have different thicknesses.

Between two resonators with mass loading layers composed of the same material, the resonator with a thicker mass loading layer has a greater mass and thus a lower resonance frequency than the resonator with a thinner electrode. Thus, the resonance frequency can be adjusted by adding or removing loads on top of the resonator's electrode.

Parallel resonators (i.e., resonators in parallel with an LBAW) can be designed to have resonance frequencies within the frequency range of one or more sidebands that are to be suppressed (e.g., the frequency range of sideband 520a). Moreover, multiple parallel resonators with different resonance frequencies can be designed to suppress a sideband over a wider range of frequencies (as compared to parallel resonators with the same resonance frequency), or to suppress multiple sidebands.

Figure 7A:
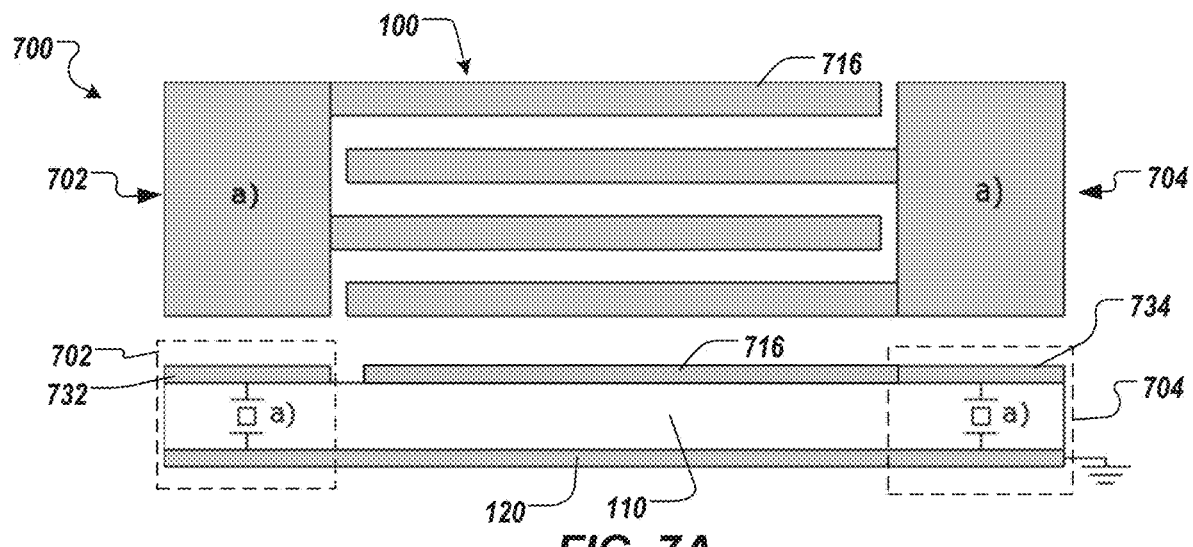
FIGS. 7A-C illustrate example band pass filters including one or more acoustic resonators in parallel with an LBAW filter.
Figure 7B:
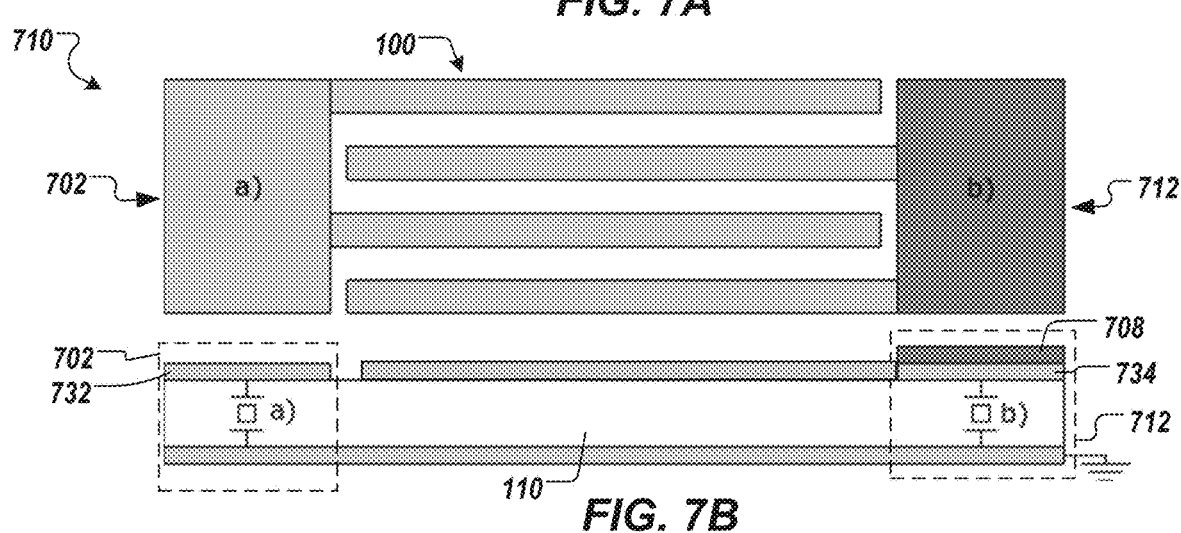
Figure 7C:
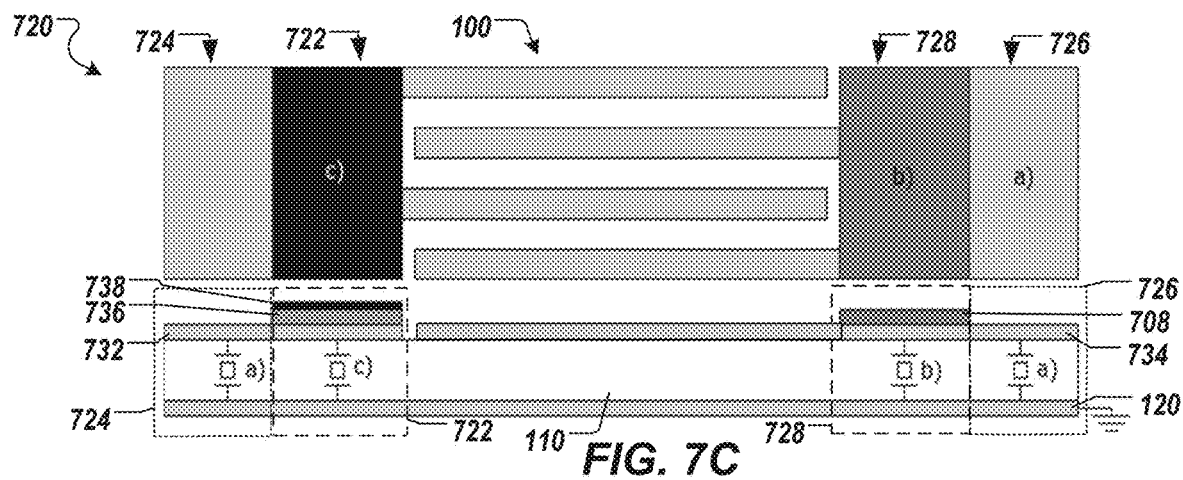

FIGS. 7A-C illustrate example band pass filters including acoustic resonators in parallel with LBAW 100. FIGS. 7A-C illustrate top views and cross-sectional views of band pass filters 700, 710, and 720, respectively. Filters 700, 710, and 720 can generally be the same, except that they may differ in one or more mass loading layers in one or more of their parallel resonators (also referred to herein as "resonators"). The filters 700, 710, 720 can be generally the same as the filter assembly 600, except as described. For example, the filters 700, 710, 720 can optionally omit the series resonators 613, 615, although such series resonators could still be included between the LBAW filter.

Filter 700 includes parallel resonators 702, 704, filter 710 includes parallel resonators 702, 712, and filter 720 includes parallel resonators 722, 724, 726, and 728. Each of resonators 702, 704, 712, 722, 724, 726, and 728 has a resonator electrode (also referred to herein as "electrode") and a resonator counter electrode. The resonator electrode and counter electrode can be used for applying driving electrical signal. One or more resonators can have a common electrode with LBAW 100 (e.g., electrode 150 or 170) such that extensions of LBAW 100 are projected from the common electrode. One or more of the resonators can have a common counter electrode with LBAW 100 (e.g., counter electrode 120). In some embodiment, the common counter electrode continuously spans the LBAW and the respective resonator that shares the common counter electrode with the LBAW. In some examples, the common counter electrode is grounded. Each of the parallel resonators 702, 704, 712, 722, 724, 726, and 728 can be made of the same or different materials as the LBAW 100. The parallel resonators can be composed of polysilicon, metal, silicon dioxide, or silicon nitride.

Referring to FIG. 7A, the filter 700 includes two parallel resonators 702, 704 that are coupled to the input and output electrodes, respectively, of LBAW 100. In particular, each parallel resonator 702, 704 includes a respective conductive layer 732, 734 as a resonator electrode, and a counter electrode that together sandwich the piezo layer 110. Each conductive layer 732, 734 is electrically coupled to the extensions 716 of the respective input and output electrodes. In particular, each of the conductive layers 732, 734 can provide a common electrode (e.g., electrode 150, 170 in FIG. 1A) from which the respective extensions 716 (e.g., extensions 150a, 170a) project for the respective input and output electrodes. The common electrode is common between the LBAW 100 and the respective parallel resonator. For example, one or both of the conductive layers 732, 734, and the LBAW extensions can be provided by separate portions of the same electrode layer on a top surface of the piezoelectric layer. The parallel resonator 702 and/or 704 can be electrically coupled to the input and/or the output electrodes or ports (e.g., ports 160, 180) of LBAW 100. The resonators 702, 704 and the LBAW 100 share a common counter electrode 120, e.g., the counter-electrode for each resonators 702, 704 can be provided by a respective portion of the counter electrode 120. The resonators 702, 704 and the LBAW 100 also share a common piezo layer 110. The counter electrode 120 can be grounded.

As previously explained, resonance frequency of either or both parallel resonators 702 and 704 can be tuned by adding mass loads to, or removing mass loads from the respective conductive layers 732, 734. To reduce resonance frequency of resonator 702, 704, a layer that provides a mass load can be deposited on top of the conductive layer 732, 734 of the respective resonator. To increase resonance frequency of resonator 702, 704, the conductive layer 732, 734 of the respective resonator can be partly removed, for example, through etching.

FIG. 7B illustrates a band pass filter 710 with parallel resonator 702 and a parallel resonator 712. In particular, the mass loading of the two resonators 702, 712 is different such that the two resonators 702, 704 have different resonant frequencies. Both resonant frequencies can be within the frequency range of the sideband 520 of LBAW 100.

The parallel resonator 712 is formed by adding a mass loading layer 708 on top of the conductive layer 734 (or electrode) of the resonator 704. In some embodiments the conductive layer 734 is composed of Aluminum (Al) or Copper (Cu), and the layer 708 is composed of silicon oxide ($SiO_2$) and/or silicon nitride (SiN). Due to the addition of the mass loading layer 708, resonator 712 can have a lower frequency than the resonator 704.

The thickness of the layer 708 can be selected to provide a desired resonance frequency for the resonator 712. For example, if the resonance frequency of resonator 704 would otherwise be higher than the frequency range of the sideband 520a, the thickness of layer 708 can be selected so that the resonance frequency shifts, to provide a resonance frequency within the sideband 520a for the resonator 712. The thickness can also be adjusted by further thickening (e.g., by depositing more material) or thinning (e.g., by etching) layer 708.

The resonator 702 can have a different thickness than the resonator 712. This thickness difference can result from different thickness of the two conductive layers 732, 734, or from a mass loading layer being present in the resonator 712 and absent in the resonator 702, or from different thicknesses of mass loading layers on the two conductive layers 732, 734.

Resonator 712 can be composed of one or more materials that are not included in resonator 702. For example, the mass loading layer 708 electrode of the resonator 702 may be composed of a material (e.g., silicon oxide, silicon nitride, etc.) different from the material of the conductive layers 732, 734 (e.g., aluminum, copper, etc.).

The layer 708 can be composed of the same material or different material than the conductive layer 734. For example, the conductor layer 734 can be composed of aluminum (Al), and the layer 708 can be composed of Al, silicon oxide and/or silicon nitride. Where the layer 708 is a conductor, e.g., the same conductive material as conductive layer 734, the resonator 712 can be considered to have a thicker electrode than the resonator 702.

Although FIG. 7B illustrates achieving different mass loading by including a mass loading layer 708 in resonator 712 and not including a mass loading layer in resonator 702, other techniques are possible. For example, both resonators can include mass loading layers of different thickness and/or material. For example, the mass loading layers of the two resonators 702, 704 can be composed of the same material but different thickness. As another example, the mass loading layers of the two resonators 702, 704 can be composed of different materials, optionally with the same thickness. Alternatively or in addition, a thickness of the resonator electrode (i.e., the conductor layer 732) of resonator 702 can differ from the thickness of the electrode (i.e., the conductive layer 734) of resonator 712.

As noted previously, multiple resonators with different resonance frequencies within the sideband can be connected to an LBAW in parallel, to suppress a wider range of frequencies (as compared to a configuration with a single parallel resonator, or a single resonance frequency) of the LBAW's sideband. Multiple parallel resonators with different resonance frequencies shunt the driving electrical signal to ground at each of the resonance frequencies. For example, when the two resonators 702 and 712 of filter 710 have different resonance frequencies that fall within sideband frequencies of the LBAW 100 (e.g., sideband 520a), the sideband is suppressed over a wider range of frequencies compared to when the two resonators have the same resonance frequencies.

Figure 8:
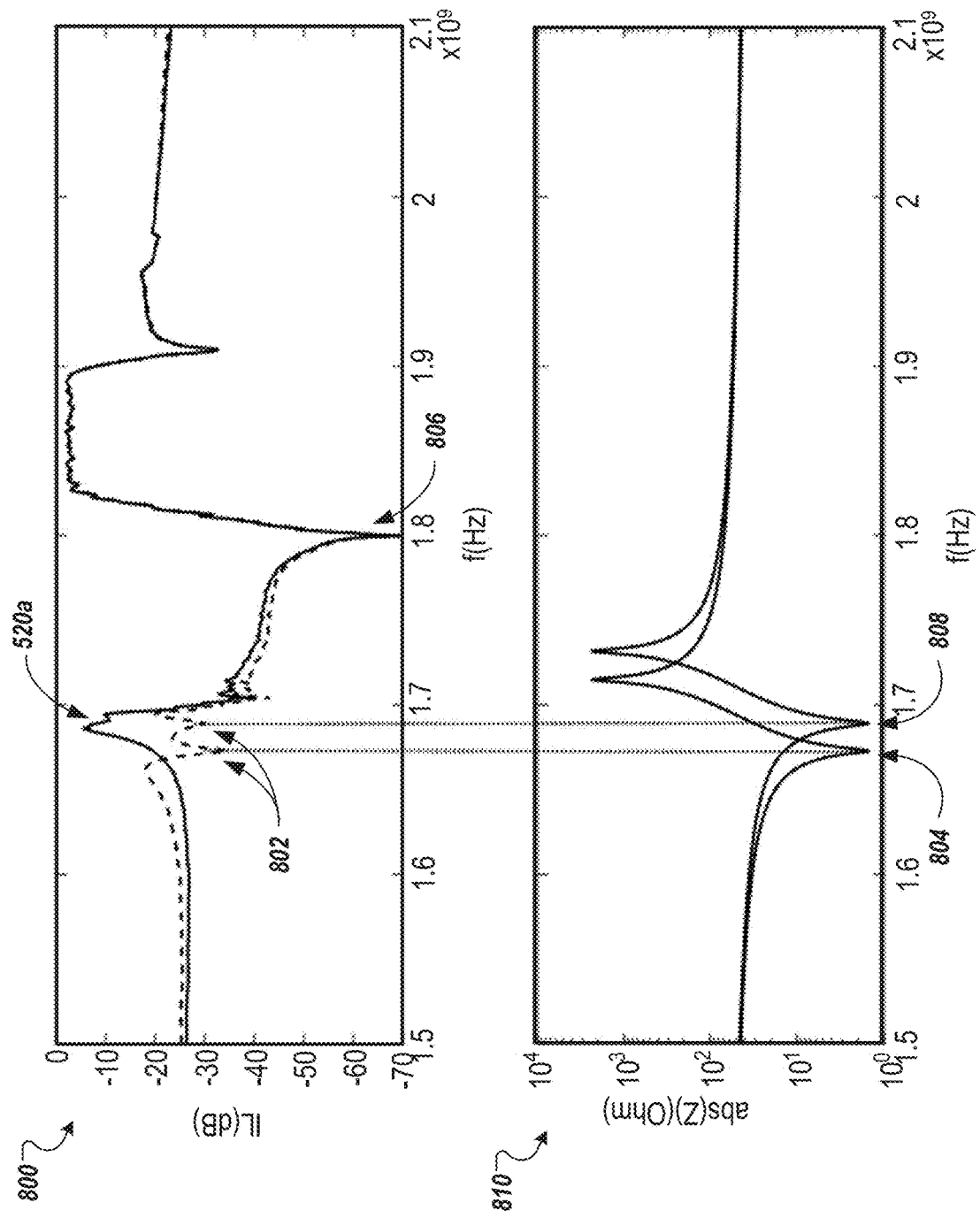
FIG. 8 depicts an experimental plot of insertion loss for an LBAW filter with multiple parallel resonators, and an experimental plot of impedances for the parallel resonators.

FIG. 8 depicts an experimental plot 800 of insertion loss for an LBAW filter with two parallel resonators, and a simulated plot 810 of impedances for the two parallel resonators. For example, the two resonators can be the resonators 722, 728 in FIG. 7C. As depicted in plot 810, the two resonators have two different resonance frequencies 804 and 808. The solid line in plot 800 corresponds to insertion loss of an LBAW. The dashed line in plot 800 depicts insertion loss of the same LBAW connected in parallel with the two resonators, whose impedances are depicted in plot 810. For example, the solid line in plot 800 can represent insertion loss of LBAW 100, and the dashed line can represent LBAW 100 in parallel with resonators 702 and 712, as shown in FIG. 7B.

As illustrated in plot 800, low impedances of the two parallel resonators at their resonance frequencies reduce transmission through the filter and cause two dips 802 in sideband 520a at the resonance frequencies 804 and 808 of the parallel resonators. The two dips reduce the overall insertion loss in the sideband and also suppress the sideband's peak. The two resonance frequencies can have a frequency difference of about 0.1 to 3% relative to their center frequency. Either of these two resonance frequencies can have a frequency difference of at least 3%, e.g., at least 10%, with respect to the frequency of the skirt edge 806.

In addition to suppressing the sideband, one or more parallel resonators can be added to an LBAW to modify steepness of passband edge of the LBAW. A parallel resonator with resonance frequency at the edge of the passband provides a sharp dip at the edge and causes a steeper skirt for the TE1 passband. Further details about specific filter arrangements and the effect on passband edges are disclosed in U.S. Pat. No. 9,893,712, incorporated herein in its entirety by reference. For example, a third parallel resonator can be added to the filter corresponding to FIG. 8 to sharpen steepness of skirt edge 806. As another example, resonance frequency of the parallel resonator 702 can be tuned to frequency of the skirt edge 806, and sharpen the steepness of the skirt edge 806.

Configurations with more than two parallel resonators can be implemented according to the techniques described herein. FIG. 7C depicts an example band pass filter 720 that includes four parallel resonators 722, 724, 726, and 728. The four resonators of the filter 720 are in parallel with the LBAW 100. Similar to the resonators 702, 704, 712, each of the resonators 722-728 includes a piezo layer that is sandwiched between a resonator electrode and a resonator counter electrode. The piezo layer (e.g., piezo 110), the counter electrode (e.g., counter electrode 120), and/or the electrode of a resonator can be common between the resonator and LBAW 100.

Resonators 724, 726 include a conductive layer 732, 734 that can be coupled to the input or the output electrodes of LBAW 100. Resonators 722 and 728 includes one or more layers of mass loading on top of their respective conductive layer 732, 734. Resonator 728 includes a mass loading layer 708 on top of the conductive layer 734. Resonator 722 includes multiple mass loading layers 732 and 738 on top of the conductive layer 732.

The layers 732, 734, 708, 736, and 738 may be composed of the same or different materials. For example, layer 732, 734 can be composed of Al or copper, and layer 708, 736, 738 can be composed of silicon oxide (SiO2), silicon nitride (SiN) and/or one or more metals. The layers 732, 734, 708, 736, and 738 may have different thicknesses. In some examples, the conductive layer 732 may have a different thickness in resonator 722 than in the resonator 724. In some examples, the conductive layer 734 may a different thickness in resonator 726 than in resonator 728.

Depending on the properties (e.g., thickness, material) of the four parallel resonators 722-728, the band pass filter 720 may act on the insertion loss as an LBAW in parallel with four or less than four resonators. When the four resonators have four different resonance frequencies, insertion loss of the filter 720 is suppressed at the four different resonance frequencies. When two of the resonators have the same resonance frequency, the insertion loss of the filter 720 is suppressed at three different frequencies because the resonators provide only three different resonance frequencies. Similarly, if three or four of the resonators have the same resonance frequency, the suppression of insertion loss happens only in two frequencies or one frequency, respectively.

For example, if resonators 724 and 726 have the same resonance frequencies, the band pass filter 720 acts on the insertion loss as an LBAW with three parallel resonators (a), (b) and (c). The parallel resonator (a) is formed by the resonators 724 and 726, the parallel resonator (b) is formed by the resonator 728, and parallel resonator (c) is formed by the resonator 722. Since the two parallel resonators 724 and 726 share the same resonance frequencies, they act as one resonator (i.e., the parallel resonator (a)) for purpose of suppressing the sideband. For example, if resonators 724 and 726 have the same size (e.g., the same thickness) and are composed of the same materials, they can have the same resonance frequencies.

Each of the layers 732, 734, 708, 736, 738 of FIGS. 7A-7C can be made of the same or different materials as the LBAW extensions (e.g., extensions 150a or 170a). In some embodiments electrodes 732, 734 and/or LBAW extensions are composed of Aluminum (Al), and the layers 708 and 736 are composed of silicon oxide ($SiO_2$) and/or silicon nitride (SiN). For example, layer 708 can be composed of $SiO_2$ and layer 736 can be composed of SiN. In some examples, a layer composed of SiO2 is less than 500 nm thick, and a layer composed of SiN is less than 100 nm thick. In some examples, a layer composed of $SiO_2$ is 50 to 250 nm thick, and a layer composed of SiN is 5-50 nm thick.

In some embodiments, one or more resonator electrodes are the uppermost layers of the respective resonators. For example, layer 708 may be used as an electrode of the resonator 712.

Figure 9A:
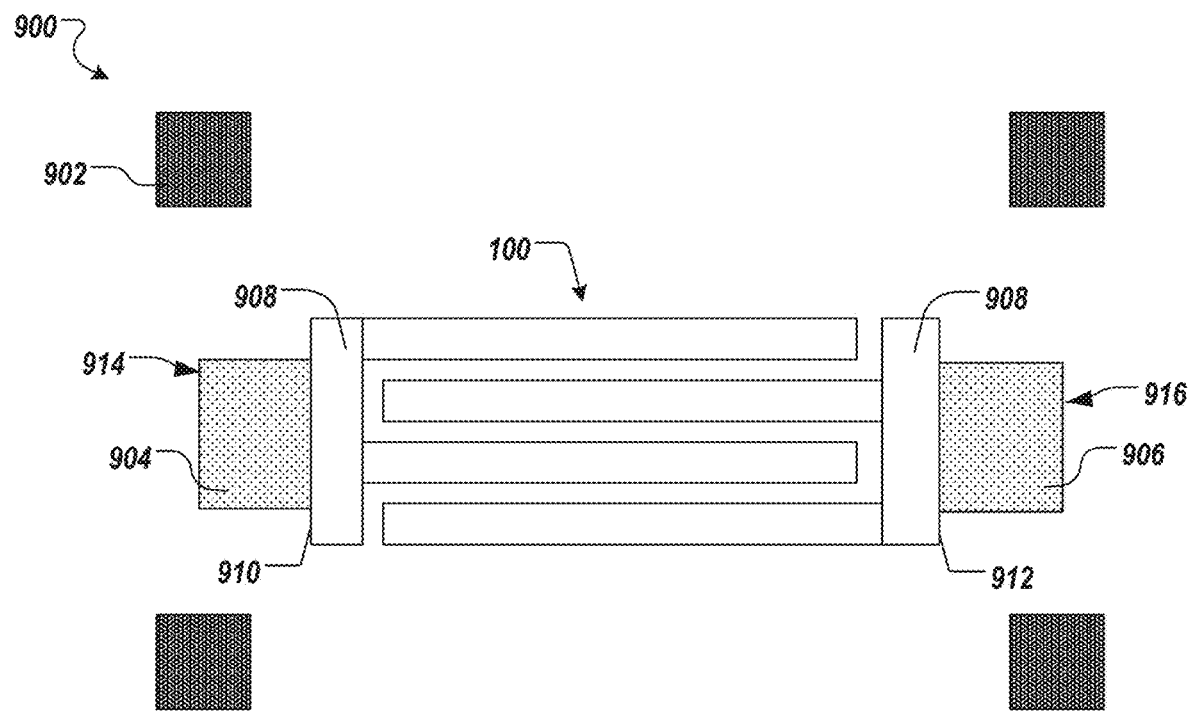
FIGS. 9A-B depict example resonators integrated to an LBAW filter through one or more connections.
Figure 9B:
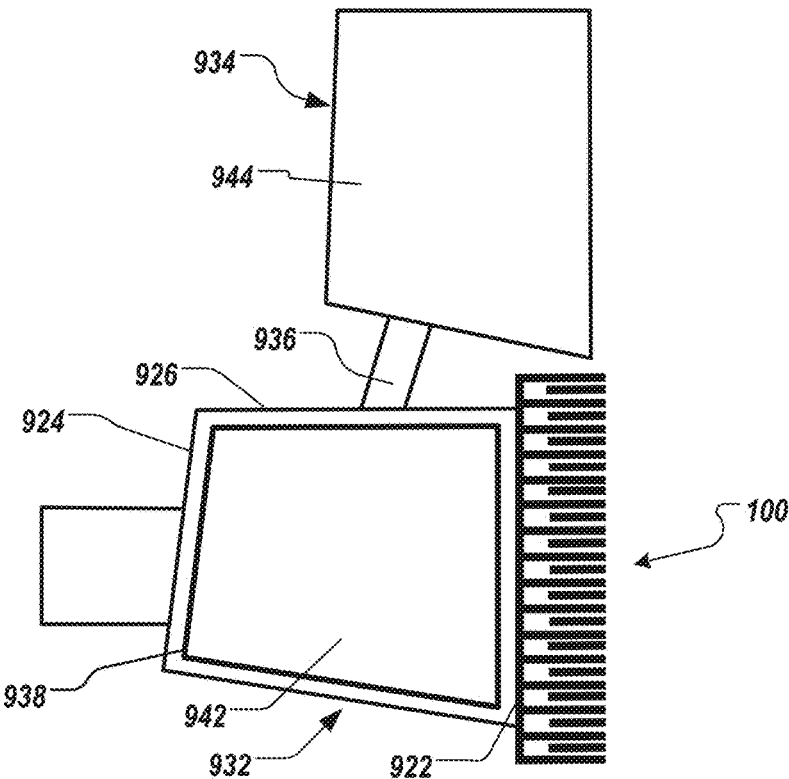

FIGS. 9A-B depict example resonators integrated into an LBAW filter through one or more connections. Filter 900 depicted in FIG. 9A can generally be any of filters 700, 710, or 720, except that it has additional resonator 914, 916 in parallel with LBAW 100. The resonators 914 and 916 include electrodes 904 and 906, respectively, that are connected to electrodes 908 through common edges 910 and 912, respectively. The electrodes 908 can be electrodes of LBAW 100, or can be electrodes of one or more resonators (e.g., resonator 702, 704, 712, 722, 724, 726, 728) in parallel with LBAW 100. The resonators 914 and 916 can be electrically coupled to input or output electrodes of LBAW 100, or to electrodes of one or more resonators in parallel with LBAW 100. For example, the electrode 908 can be the conductive layer 734 and can be electrically coupled to resonator electrode 906 by sharing the common edge 912. The resonators 914 and 916 share a common counter electrode 120 (see FIG. 1A) with the LBAW 100. The resonators 914 and 916 can also share a common piezo layer 110 with LBAW 100. The counter electrode 120 can be grounded. Ground vias (or contacts) 902 are also depicted in FIG. 9A.

One or more parallel resonators can also be connected to an LBAW or to one or more other parallel resonators through one or more conductive lines. FIG. 9B depicts a conductive line 936 connecting a first parallel resonator 932 to a second parallel resonator 934. The first parallel resonator 932 has a first electrode 942, and the second parallel resonator has a second electrode 944. The first electrode 942 has a first edge 922 facing the LBAW filter 100, a second edge 924 farther from the LBAW filter, and a third edge connecting the first edge and the second edge. The second electrode 944 can be connected to any sides, edges, or corners of the first electrode 942. In the depicted example, the second electrode 944 is positioned adjacent to the third edge 926 of the first electrode 942. In some examples (not shown), the second electrode 944 can be positioned adjacent to the second edge 924 of the first electrode 942. In the depicted example, there is a gap between the first electrode 942 and the second electrode 944; the gap is bridges by the conductive line 936. In some embodiments, the first and the second electrodes share a common edge (similar to the common edge 910 between electrodes 908 and 904 in FIG. 9A). The first and the second parallel resonators 932 and 934 are electrically coupled through the first electrode 942 and the second electrode 944, for example, by sharing a common edge, or a conductive line.

Electrodes of the first and/or second parallel resonators 932, 934 can be loaded by one or more mass loading layers (e.g., layer 708, 736, 738). The one or more mass loading layers can be selected so that resonance frequency of the respective parallel resonator falls within a sideband of LBAW 100. Sizes (e.g., thickness) of the first electrode 942, the second electrode 944, and/or the conductive line 936 can be adjusted for tuning resonance frequencies of the respective resonators in LBAW 100's sideband.

Figure 10:
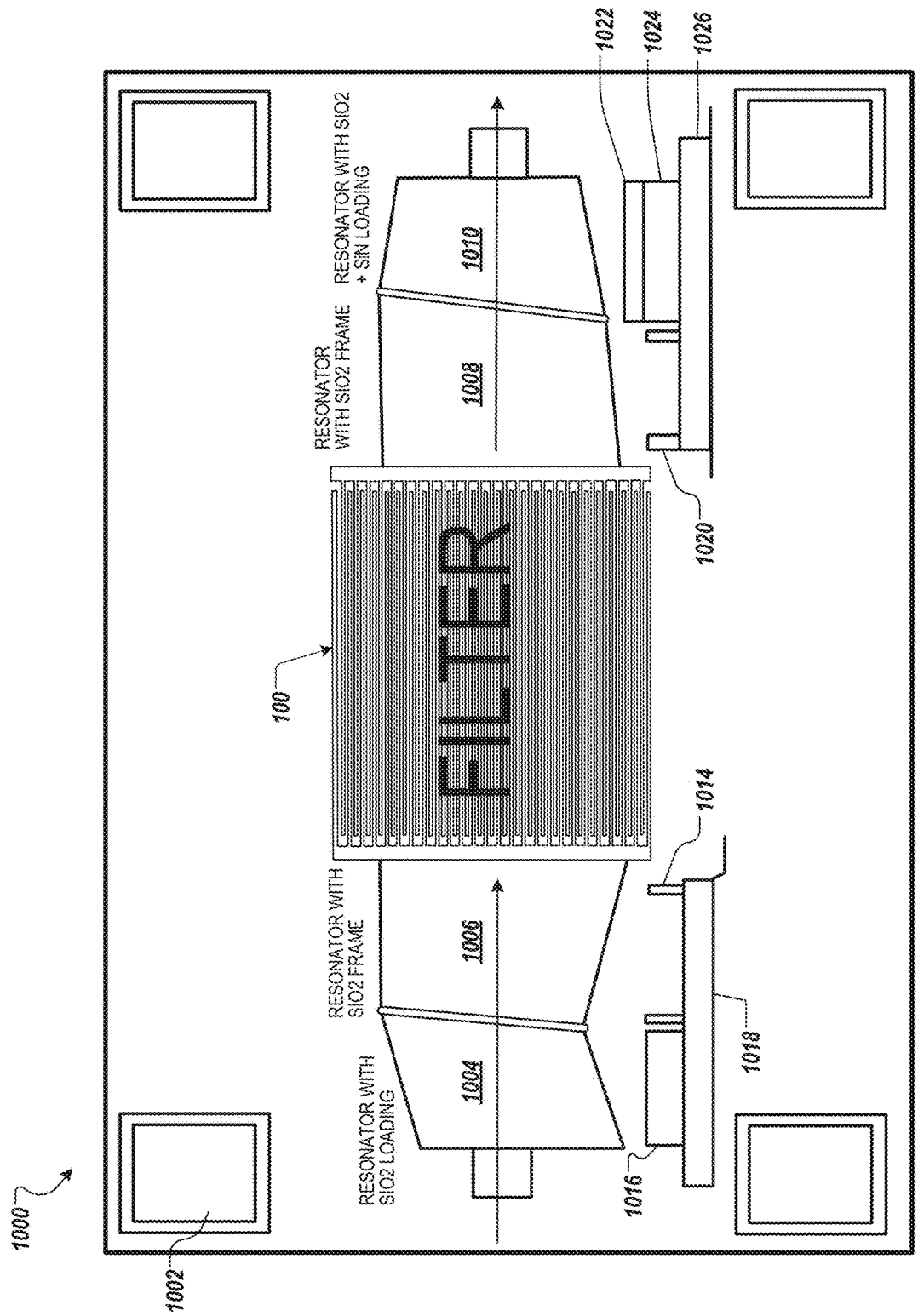
FIG. 10 depicts an example of a filter including an LBAW in parallel with multiple resonators.

FIG. 10 depicts another example of a filter 1000 including LBAW 100 in parallel with multiple resonators. Ground vias 1002 are also depicted in FIG. 10.

Resonators 1004, 1006, 1008, and 1010 are in parallel with LBAW 100. The resonators share a counter electrode 120 (see FIG. 1A) with LBAW 100. The counter electrode 120 can be grounded. Resonators 1004 and 1006 share a conductive electrode layer 1018, and resonators 1008 and 1010 share a conductive electrode layer 1026. Either or both of the layers 1018 and 1026 can be electrically coupled with input and/or output electrodes of LBAW 100. In some examples, one or both layers 1018 and 1026 can provide a common electrode between LBAW and one or more resonators. Extensions of LBAW 100 project from the common electrode. Each of the layers 1018 and 1026 can be composed of metal, for example, Al.

Resonator 1004 includes a mass loading layer 1016 on top of the conductive electrode layer 1018. Layer 1016 covers a portion of layer 1018. The layer 1016 can cover substantially all of the electrode layer 1018 within the resonator 1004.

Resonator 1006 includes a mass loading layer 1014 on top of the electrode layer 1018. The layer 1014 can be in form of a frame, e.g., walls that are relatively thin compared to the region enclosed by the walls. The frame can form a hollow polygon. The frame can extend along the perimeter of the resonator 1006. For example, in FIG. 9B, frame 938 is formed (e.g., by deposition or etching) on top of electrode 932 and can provide a frame-shape resonator. Further details about frame-shape resonators can be found in PCT App. No. PCT/FI00/00591, entitled "Resonator Structure and a Filter Comprising Such a Resonator Structure," which is incorporated herein in its entirety.

Resonator 1008 includes a mass loading layer 1020 on top of the electrode layer 1026. Similar to layer 1014, layer 1020 can be in form of a frame.

Resonator 1010 includes two mass loading layers 1022 and 1024 on top of the layer electrode 1026. Each of the mass loading layers 1022 and 1024 can cover substantially all of the electrode layer 1026 within the resonator 1010. Layer 1022 may cover the whole, or part of the layer 1024's surface.

Each of the mass loading layers 1014, 1016, 1020, 1022, and 1024 (each can also be referred to as a "load") can be composed of metal or semiconductor material. In the example filter 1000, layers 1014, 1016, 1020, and 1024 are composed of $SiO_2$, and the layer 1022 is composed of SiN. In some embodiments, thickness of $SiO_2$ layers are lower than 500 nm, and thickness of SiN layers are lower than 100 nm. For example, thickness of $SiO_2$ layers can be 50 to 250 nm, and thickness of SiN layers can be 5 to 50 nm.

In embodiments with multiple parallel resonators, two or more of the resonators can have electrodes of the same shape, or can have electrodes of different shapes (or sizes). For example, the conductive layer 732 in FIG. 7A can be circular and the conductive layer 734 can be rectangular. A resonator (e.g., one or both electrodes of the resonator) can also have a gradient thickness to spread out the shunting effect over a range of frequency.

The resonance frequency of a resonator can also be tuned by adjusting lateral shape of the resonator. Larger resonators (e.g., resonators with large electrode surfaces) have lower resistance at their resonance frequencies, and provide a stronger shunting effect. Thus, to have a strong shunting effect, a large resonator with high Q (sharp response peak and low resistance) can be a desirable resonator for suppressing LBAW sideband.

If a resonator's width (e.g., a resonator electrode's width) is narrower than a threshold width, its resonance frequency starts to depend on the resonator's width. For such narrow resonators, the resonance frequency depends on the width of the resonator, and the narrower the resonator is, the higher its resonance frequency gets (assuming Type 2 dispersion, i.e. frequency increasing with decreasing lateral wavelength).

A resonator can be of any shape, such as circular, rectangular, doughnut, etc. For example, an electrode of LBAW can be in form of a doughnut and form a parallel resonator in doughnut shape. Impedance of a narrow doughnut resonator can peak at more than one resonance frequency, resulting in suppression of insertion loss over a wider range of frequencies compared to single resonance frequency resonators (e.g., a rectangular resonator). It should be noted that in deciding the form of a resonator, both resonance frequency and resistance of the resonator at the resonance frequency should be considered. For example, compared to a rectangular resonator a doughnut resonator may have multiple resonance frequencies but higher resonance at each resonance frequencies, resulting in a milder shunting effect at the resonance frequencies.

A number of implementations have been described. Nevertheless, it will be understood that various modifications may be made without departing from the spirit and scope of disclosure. Accordingly, other implementations are within the scope of the following claims.

What is claimed is:

1. A method of fabricating an acoustic wave filter device, the method comprising:
    forming an acoustic wave filter element and a first resonator coupled to the acoustic wave filter element,
       wherein the acoustic wave filter element comprises interdigitated input electrodes and output electrodes located on a top surface of a piezoelectric layer and a counter-electrode on a bottom surface of the piezoelectric layer, wherein the acoustic wave filter element provides a response with a sideband at a sideband frequency range, and
       wherein the first resonator comprises a first resonator electrode on the top surface of the piezoelectric layer and a first resonator counter-electrode on the bottom surface of the piezoelectric layer, the first resonator having a first notch in resonator impedance at a first resonance frequency; and
    tuning the first resonance frequency to fall within the sideband frequency range to suppress the sideband by depositing a first mass load on top of the first resonator electrode to reduce the first resonance frequency, or partly removing the first resonator electrode to increase the first resonance frequency.

2. The method of claim 1, wherein the forming further comprises forming a second resonator coupled to the acoustic wave filter element, the second resonator comprising a second resonator electrode on the top surface of the piezoelectric layer, a second resonator counter-electrode on the bottom surface of the piezoelectric layer,
    wherein the second resonator has a second notch in resonator impedance at a second resonance frequency that is different from the first resonance frequency.

3. The method of claim 2, further comprising tuning the second resonance frequency to fall within the sideband frequency range by
    depositing a second mass load on top of the second resonator electrode to reduce the second resonance frequency, or
    partly removing the second resonator electrode to increase the second resonance frequency.

4. The method of claim 3, wherein a tuned second resonance frequency obtained by the tuning of the second resonance frequency is different from a tuned first resonance frequency obtained by the tuning of the first resonance frequency.

5. The method of claim 3, wherein the first mass load and the second mass load are composed of a same material but with different thicknesses, wherein the same material comprises metal or semiconductor material.

6. The method of claim 3, wherein the first resonance frequency and the second resonance frequency differ by at least 3%.

7. The method of claim 3, wherein the first resonator electrode is electrically coupled to the input electrodes, and the second resonator electrode is electrically coupled to the output electrodes.

8. The method of claim 3, wherein the first resonator electrode is electrically coupled to the second resonator electrode.

9. The method of claim 8, wherein the first resonator electrode has a first edge facing the acoustic wave filter element, a second edge on a side of the first resonator electrode farther from the acoustic wave filter element, and a third edge connecting the first edge and the second edge, and
    wherein the second resonator electrode is positioned adjacent the second edge of the first resonator electrode.

10. The method of claim 8, wherein the first resonator electrode has a first edge facing the acoustic wave filter element, a second edge on a side of the first resonator electrode farther from the acoustic wave filter element, and a third edge connecting the first edge and the second edge, and
    wherein the second resonator electrode is positioned adjacent the third edge of the first resonator electrode.

11. The method of claim 8, wherein the first resonator electrode and the second resonator electrode are electrically coupled by sharing a common edge.

12. The method of claim 8, wherein the first resonator electrode and the second resonator electrode are electrically coupled by a conductive line that bridges a gap between the first resonator electrode and the second resonator electrode.

13. The method of claim 3, wherein a first portion of the first mass load is attached to the first resonator electrode, a second portion of the first mass load is attached to the second resonator electrode, and the first portion and the second portion have different thicknesses.

14. The method of claim 1, wherein the first mass load covers only a portion of the top of the first resonator electrode.

15. The method of claim 1, wherein the forming comprises forming the input electrodes, the output electrodes, and the first resonator electrode by separate portions of the same electrode layer on the top surface of the piezoelectric layer.

16. The method of claim 1, wherein the acoustic wave filter element is a laterally acoustically coupled bulk acoustic wave (LBAW) filter.

17. The method of claim 1, wherein the first mass load is composed of the same material of the first resonator electrode.

18. The method of claim 1, wherein the first mass load is composed of a different material than the first resonator electrode.

19. The method of claim 1, wherein the counter-electrode of the acoustic wave filter element and the first resonator counter-electrode are provided by a common counter-electrode that continuously spans the acoustic wave filter element and the first resonator.

20. The method of claim 1, wherein the first resonator is in direct contact with a plurality of electrodes in at least one of the input electrodes or the output electrodes such that the plurality of electrodes extend from an edge of the first resonator electrode and are spaced apart along the edge of the first resonator electrode.

* * * * *